(12) United States Patent
Kim et al.

(10) Patent No.: US 11,282,583 B2
(45) Date of Patent: Mar. 22, 2022

(54) SEMICONDUCTOR MEMORY DEVICE AND METHOD OF OPERATING THE SAME

(71) Applicant: SK hynix Inc., Icheon-si (KR)

(72) Inventors: Jong Woo Kim, Icheon-si (KR); Yu Jong Noh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/940,887

(22) Filed: Jul. 28, 2020

(65) Prior Publication Data

US 2021/0264993 A1 Aug. 26, 2021

(30) Foreign Application Priority Data

Feb. 21, 2020 (KR) ........................ 10-2020-0021654

(51) Int. Cl.
  *G11C 16/34* (2006.01)
  *G11C 16/04* (2006.01)
  *G11C 16/08* (2006.01)
  *G11C 16/10* (2006.01)

(52) U.S. Cl.
  CPC ...... *G11C 16/3454* (2013.01); *G11C 16/0433* (2013.01); *G11C 16/08* (2013.01); *G11C 16/10* (2013.01)

(58) Field of Classification Search
  CPC . G11C 16/3454; G11C 16/0433; G11C 16/08; G11C 16/10
  USPC ........................................ 365/185.22, 185.24
  See application file for complete search history.

(56) References Cited

U.S. PATENT DOCUMENTS

| 11,101,009 | B1* | 8/2021 | Ray ..................... G11C 16/10 |
| 2011/0083050 | A1* | 4/2011 | Aritome ............. G11C 16/3445 714/721 |
| 2011/0090738 | A1* | 4/2011 | Park ..................... G11C 16/12 365/185.17 |
| 2011/0222340 | A1* | 9/2011 | Lee ................... G11C 16/0483 365/185.2 |
| 2011/0249494 | A1* | 10/2011 | Aritome ............. G11C 16/0483 365/185.02 |
| 2011/0310666 | A1* | 12/2011 | Miida ................. H01L 27/11526 365/185.11 |

(Continued)

FOREIGN PATENT DOCUMENTS

| KR | 1020130137470 A | 12/2013 |
| KR | 101872563 B1 | 6/2018 |

*Primary Examiner* — Michael T Tran
(74) *Attorney, Agent, or Firm* — William Park & Associates Ltd.

(57) ABSTRACT

A semiconductor memory device, and a method of operating the same, includes a memory cell array, a peripheral circuit, and control logic. The memory cell array includes a plurality of memory blocks. The peripheral circuit is configured to perform a program operation on the memory cell array. The control logic is configured to control the program operation performed by the peripheral circuit. Each of the plurality of memory blocks is coupled to a drain select line, a plurality of word lines, and first and second source select lines that correspond to the memory block. During a program operation performed on a first memory block selected as a program target, among the plurality of memory blocks, the control logic controls the peripheral circuit so that a first source select line of a second memory block that is not selected as the program target, among the plurality of memory blocks, floats.

19 Claims, 15 Drawing Sheets

(56) References Cited

U.S. PATENT DOCUMENTS

| | | | |
|---|---|---|---|
| 2012/0300551 A1* | 11/2012 | Mihnea | G11C 16/3404 |
| | | | 365/185.17 |
| 2017/0178739 A1* | 6/2017 | Maejima | G11C 16/0483 |
| 2019/0088333 A1* | 3/2019 | Shirakawa | G11C 16/08 |
| 2019/0156901 A1* | 5/2019 | Chen | G11C 16/10 |
| 2020/0013467 A1* | 1/2020 | Yamada | G11C 16/26 |
| 2020/0312413 A1* | 10/2020 | Wang | G11C 16/10 |
| 2020/0410037 A1* | 12/2020 | Nardi | G11C 16/08 |
| 2021/0020651 A1* | 1/2021 | Sakotsu | H01L 29/7883 |
| 2021/0065808 A1* | 3/2021 | Wang | G11C 16/08 |
| 2021/0065815 A1* | 3/2021 | Lee | G11C 16/28 |
| 2021/0065816 A1* | 3/2021 | Lee | G11C 16/34 |
| 2021/0125674 A1* | 4/2021 | Chen | G11C 16/3427 |
| 2021/0173559 A1* | 6/2021 | Nishikawa | G06F 3/0679 |
| 2021/0193230 A1* | 6/2021 | Chen | G11C 16/0483 |
| 2021/0217770 A1* | 7/2021 | Song | H01L 27/11556 |
| 2021/0264996 A1* | 8/2021 | Lin | G11C 16/10 |
| 2021/0280591 A1* | 9/2021 | Chen | G11C 16/0408 |
| 2021/0295922 A1* | 9/2021 | Huang | G11C 16/10 |
| 2021/0295932 A1* | 9/2021 | Sarwar | G11C 16/3427 |
| 2021/0327520 A1* | 10/2021 | Pitner | G11C 16/26 |
| 2021/0335432 A1* | 10/2021 | Manganelli | G11C 16/26 |

* cited by examiner

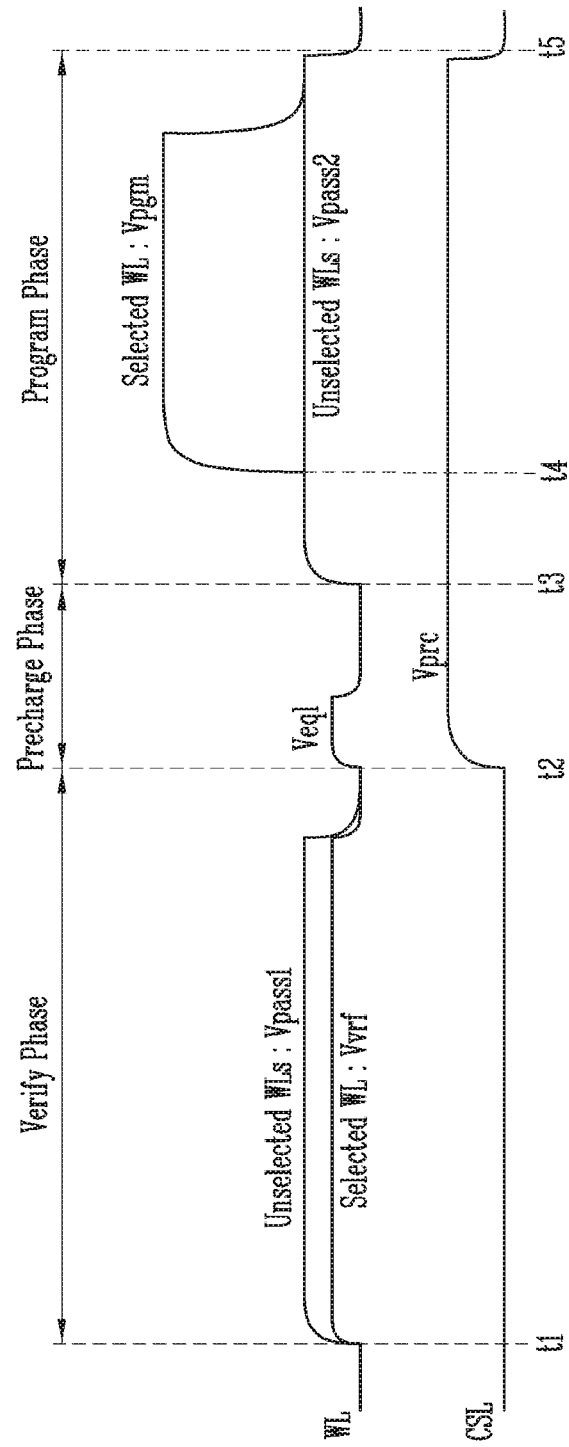

SEMICONDUCTOR MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0021654, filed on Feb. 21, 2020, in the Korean Intellectual Property Office, the entire disclosure of which is incorporated herein by reference.

BACKGROUND

1. Technical Field

Various embodiments of the present disclosure generally relate to an electronic device, and more particularly, to a semiconductor memory device and a method of operating the semiconductor memory device.

2. Related Art

A memory device may have a two-dimensional (2D) structure in which strings are horizontally arranged on a semiconductor substrate. Alternatively, the memory device may have a three-dimensional (3D) structure in which strings are vertically stacked on a semiconductor substrate. As memory devices having a 2D structure are reaching their physical scaling limit (i.e., limit in the degree of integration), semiconductor manufacturers are producing 3D memory devices that include a plurality of memory cells vertically stacked on a semiconductor substrate.

SUMMARY

Various embodiments of the present disclosure are directed to a semiconductor memory device and a method of operating the semiconductor memory device, which can improve program speed.

In accordance with an embodiment of the present disclosure, a semiconductor memory device includes a memory cell array, a peripheral circuit, and control logic. The memory cell array includes a plurality of memory blocks. The peripheral circuit is configured to perform a program operation on the memory cell array. The control logic is configured to control the program operation performed by the peripheral circuit. Each of the plurality of memory blocks is coupled to a drain select line, a plurality of word lines, and first and second source select lines that correspond to the memory block. During a program operation performed on a first memory block selected as a program target, among the plurality of memory blocks, the control logic controls the peripheral circuit so that a first source select line of a second memory block that is not selected as the program target, among the plurality of memory blocks, floats.

In an embodiment, the program operation may include a plurality of program loops, each including a precharge phase, a program phase, and a verify phase. The first memory block and the second memory block may be coupled to a common source line. The first source select line may be disposed closer to the common source line than the second source select line. In the precharge phase, the control logic may control the peripheral circuit so that the first source select line coupled to the second memory block floats and a ground voltage is applied to a second source select line coupled to the second memory block.

In an embodiment, in the precharge phase, the control logic may control the peripheral circuit so that the ground voltage is applied to a drain select line coupled to the second memory block.

In an embodiment, in the precharge phase, the control logic may control the peripheral circuit so that a precharge voltage is applied to the common source line in a state in which the first source select line coupled to the second memory block floats.

In an embodiment, the peripheral circuit may include a first select line control switch and a second select line control switch. The first select line control switch may be configured to selectively couple a first source select line of the first memory block to a first selection ground line and to selectively couple a second source select line and a drain select line of the first memory block to a second selection ground line. The second select line control switch may be configured to selectively couple the first source select line of the second memory block to the first selection ground line and to selectively couple the second source select line and a drain select line of the second memory block to the second selection ground line.

In an embodiment, during the program operation performed on the first memory block, the first select line control switch may be deactivated. During the program operation performed on the first memory block, the second select line control switch is activated and then configured to electrically couple the first source select line of the second memory block to the first selection ground line and to electrically couple the second source select line and the drain select line of the second memory block to the second selection ground line.

In an embodiment, in the precharge phase during the program operation performed on the first memory block, the first selection ground line floats.

In an embodiment, in the precharge phase during the program operation performed on the first memory block, the ground voltage is applied to the second selection ground line.

In an embodiment, each of the plurality of memory blocks may be further coupled to a third source select line. The third source select line may be interposed between the first source select line and the second source select line.

In an embodiment, during the program operation performed on the first memory block selected as the program target, among the plurality of memory blocks, the control logic may control the peripheral circuit so that a third source select line of the second memory block that is not selected as the program target, among the plurality of memory blocks, floats.

In an embodiment, during the program operation performed on the first memory block selected as the program target, among the plurality of memory blocks, the control logic may control the peripheral circuit so that the ground voltage is applied to a third source select line of the second memory block that is not selected as the program target, among the plurality of memory blocks.

According to an embodiment of the present disclosure, a method of operating a semiconductor memory device is provided. The semiconductor memory device performs a program operation on a memory block selected from among a plurality of memory blocks. The program operation includes a plurality of program loops. Each program loop includes a precharge phase of precharging a common source line, a program phase of programming a selected memory block, and a verify phase of verifying the selected memory block. The precharge phase of precharging the common source line includes allowing a first source select line, among a plurality of source select lines coupled to an unselected memory block among the plurality of memory blocks, to float.

In an embodiment, the precharge phase of precharging the common source line may include allowing the first source select line of the unselected memory block to float, applying a ground voltage to a second source select line, among the plurality of source select lines coupled to the unselected memory block, and applying a precharge voltage to the common source line.

In an embodiment, the first source select line may be disposed closer to the common source line than the second source select line.

In an embodiment, applying the ground voltage to the second source select line may include applying the ground voltage to a drain select line coupled to the unselected memory block.

In an embodiment, the program phase of programming the selected memory block may include applying a program pass voltage to a plurality of word lines coupled to the selected memory block, and applying a program voltage to a word line selected from among the plurality of word lines.

In an embodiment, the program phase of programming the selected memory block may include allowing the first source select line coupled to the unselected memory block to remain floating.

In an embodiment, the verify phase of verifying the selected memory block may include applying the ground voltage to the common source line, applying the ground voltage to the first source select line coupled to the unselected memory block, and applying a verify voltage to a word line selected from among a plurality of word lines coupled to the selected memory block and applying a verify pass voltage to unselected word lines.

In an embodiment, applying the ground voltage to the first source select line may include applying the ground voltage to a second source select line, among the plurality of source select lines coupled to the unselected memory block.

In an embodiment, the precharge phase of precharging the common source line may include applying an equalize voltage to a plurality of word lines coupled to the selected memory block.

BRIEF DESCRIPTION OF THE DRAWINGS

FIG. 6 is a diagram for describing a program operation of a semiconductor memory device 100.

FIG. 7 is a timing diagram illustrating in detail a part of the program operation illustrated in FIG. 6.

DETAILED DESCRIPTION

Specific structural or functional descriptions for embodiments of the present disclosure introduced in this specification or application are exemplified to describe embodiments according to the concept of the present disclosure. The embodiments according to the concept of the present disclosure may be practiced in various forms, and should not be construed as being limited to the embodiments described in the specification or application.

Figure 1:
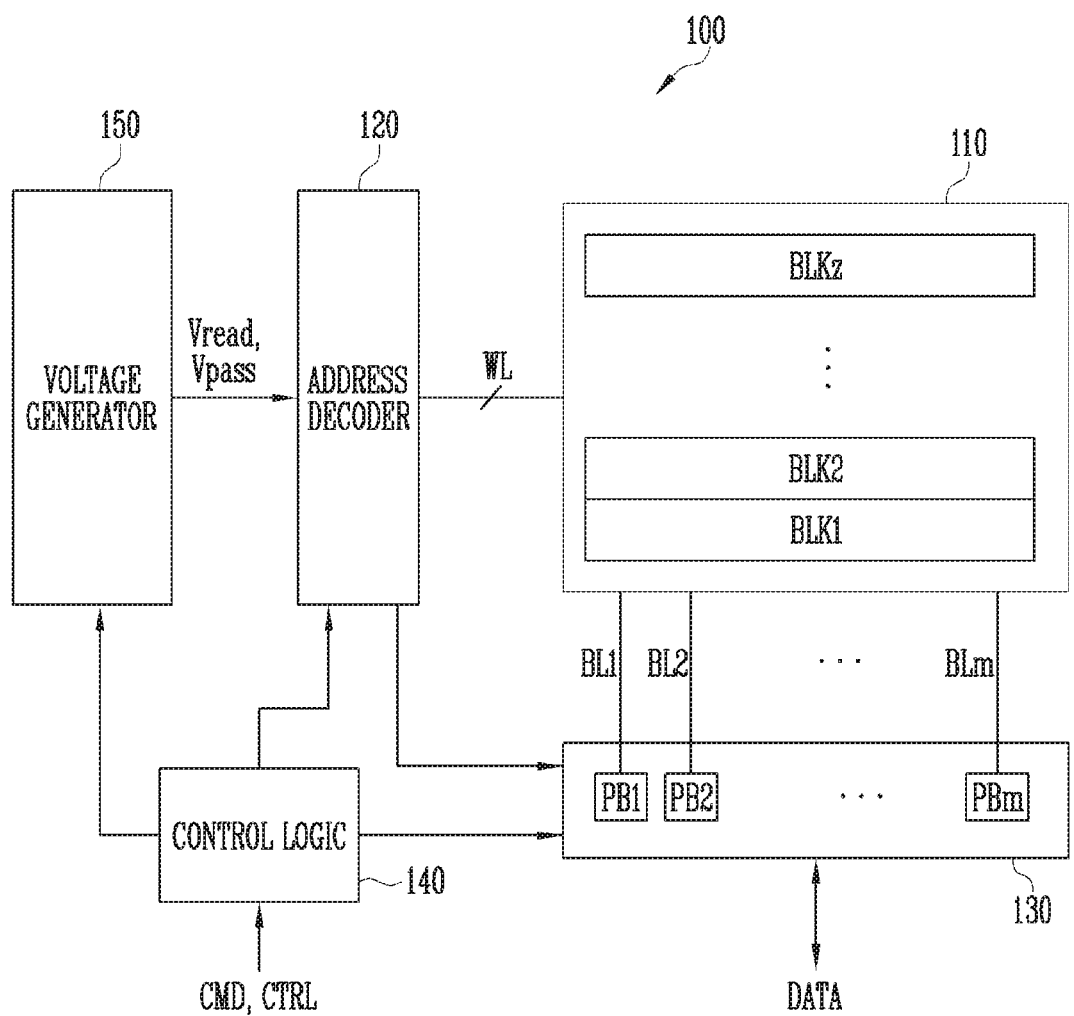
FIG. 1 is a diagram illustrating a semiconductor memory device according to an embodiment of the present disclosure.

FIG. 1 is a block diagram illustrating a semiconductor memory device according to an embodiment of the present disclosure.

Referring to FIG. 1, a semiconductor memory device 100 may include a memory cell array 110, an address decoder 120, a read and write circuit 130, control logic 140, and a voltage generator 150.

The memory cell array 110 may include a plurality of memory blocks BLK1 to BLKz. The memory blocks BLK1 to BLKz may be coupled to the address decoder 120 through word lines WL. The memory blocks BLK1 to BLKz may be coupled to the read and write circuit 130 through bit lines BL1 to BLm. Each of the memory blocks BLK1 to BLKz may include a plurality of memory cells. In an embodiment, the plurality of memory cells may be nonvolatile memory cells, and may be implemented as nonvolatile memory cells having a vertical channel structure. The memory cell array 110 may be implemented as a memory cell array having a two-dimensional (2D) structure. In an embodiment, the memory cell array 110 may be implemented as a memory cell array having a three-dimensional (3D) structure. Each of the memory cells included in the memory cell array may store at least one bit of data. In an embodiment, each of the memory cells included in the memory cell array 110 may be a single-level cell (SLC), which stores one bit of data. In an embodiment, each of the memory cells included in the memory cell array 110 may be a multi-level cell (MLC), which stores two bits of data. In an embodiment, each of the memory cells included in the memory cell array 110 may be a triple-level cell, which stores three bits of data. In an embodiment, each of the memory cells included in the memory cell array 110 may be a quad-level cell, which stores four bits of data. In various embodiments, the memory cell array 110 may include a plurality of memory cells, each of which stores 5 or more bits of data.

The address decoder 120, the read and write circuit 130, and the voltage generator 150 are operated as peripheral circuits for driving the memory cell array 110. Here, the peripheral circuits are operated under the control of the control logic 140. The address decoder 120 is coupled to the memory cell array 110 through the word lines WL. The address decoder 120 may be operated under the control of the control logic 140. The address decoder 120 may receive addresses through an input/output buffer (not illustrated) provided in the semiconductor memory device 100.

The address decoder 120 may decode a block address, among the received addresses. The address decoder 120 selects at least one memory block based on the decoded block address. When a read voltage application operation is performed during a read operation, the address decoder 120 may apply a read voltage Vread, generated by the voltage generator 150, to a selected word line of a selected memory block, and may apply a pass voltage Vpass to remaining unselected word lines. During a program verify operation, the address decoder 120 may apply a verify voltage, generated by the voltage generator 150, to a selected word line of a selected memory block, and may apply the pass voltage Vpass to remaining unselected word lines.

The address decoder 120 may decode a column address, among the received addresses. The address decoder 120 may transmit the decoded column address to the read and write circuit 130.

The read and program operations of the semiconductor memory device 100 are each performed on a page basis. Addresses received at the request of read and program operations may include a block address, a row address and a column address. The address decoder 120 may select one memory block and one word line in accordance with the block address and the row address. The column address may be decoded by the address decoder 120, and may then be provided to the read and write circuit 130.

The address decoder 120 may include a block decoder, a row decoder, a column decoder, an address buffer, etc.

The read and write circuit 130 includes a plurality of page buffers PB1 to PBm. The read and write circuit 130 may be operated as a "read circuit" during a read operation of the memory cell array 110 and as a "write circuit" during a write operation thereof. The plurality of page buffers PB1 to PBm are coupled to the memory cell array 110 through the bit lines BL1 to BLm. During a read or program verify operation, in order to sense threshold voltages of the memory cells, the page buffers PB1 to PBm may continuously supply sensing current to the bit lines coupled to the memory cells while each of the page buffers PB1 to PBm senses, through a sensing node, a change in the amount of flowing current depending on the program state of a corresponding memory cell and latches it as sensing data. The read and write circuit 130 is operated in response to page buffer control signals output from the control logic 140.

During a read operation, the read and write circuit 130 may sense data stored in the memory cells and temporarily store read data, and may then output data DATA to the input/output buffer (not illustrated) of the semiconductor memory device 100. In an embodiment, the read and write circuit 130 may include a column select circuit or the like as well as the page buffers (or page resistors).

The control logic 140 is coupled to the address decoder 120, the read and write circuit 130, and the voltage generator 150. The control logic 140 may receive a command CMD and a control signal CTRL through the input/output buffer (not illustrated) of the semiconductor memory device 100. The control logic 140 may control the overall operation of the semiconductor memory device 100 in response to the control signal CTRL. Also, the control logic 140 may output a control signal for controlling the precharge potential level of the sensing node of the plurality of page buffers PB1 to PBm. The control logic 140 may control the read and write circuit 130 to perform a read operation of the memory cell array 110. The control logic 140 may control the voltage generator 150 so that various voltages to be used for the program operation of the memory cell array 110 are generated. Also, the control logic 140 may control the address decoder 120 so that the voltages generated by the voltage generator 150 are transferred to local lines of a memory block that is the target of operation through global lines. Meanwhile, the control logic 140 may control the read and write circuit 130 so that, during a read operation, the read and write circuit 130 reads data from a selected page of the memory block through the bit lines BL1 to BLm and stores the read data in the page buffers PB1 to PBm. Furthermore, the control logic 140 may control the read and write circuit 130 so that, during a program operation, the read and write circuit 130 programs the data, stored in the page buffers PB1 to PBm, to a selected page. The control logic 140 may be implemented as hardware, software, or a combination of hardware and software. For example, the control logic 140 may be a control logic circuit operating in accordance with an algorithm and/or a processor executing control logic code.

The voltage generator 150 may generate a read voltage Vread and a pass voltage Vpass required for a read operation in response to the control signal output from the control logic 140. The voltage generator 150 may include a plurality of pumping capacitors for receiving an internal supply voltage to generate a plurality of voltages having various voltage levels, and may generate a plurality of voltages by selectively enabling the plurality of pumping capacitors under the control of the control logic 140.

The address decoder 120, the read and write circuit 130, and the voltage generator 150 may function as "peripheral circuits" which perform a read operation, a write operation, and an erase operation on the memory cell array 110. The peripheral circuits may perform a read operation, a write operation, and an erase operation on the memory cell array 110 under the control of the control logic 140.

Figure 2:
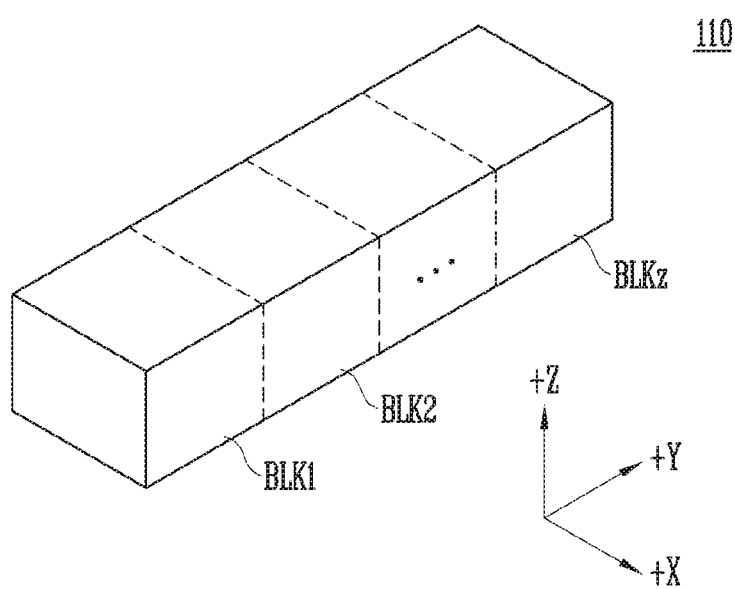
FIG. 2 is a block diagram illustrating an embodiment of a memory cell array 110 of FIG. 1.

FIG. 2 is a block diagram illustrating an embodiment of the memory cell array 110 of FIG. 1.

Referring to FIG. 2, the memory cell array 110 may include a plurality of memory blocks BLK1 to BLKz. Each memory block may have a three-dimensional (3D) structure. Each memory block includes a plurality of memory cells stacked on a substrate, Such memory cells are arranged along a positive X (+X) direction, a positive Y (+Y) direction, and a positive Z (+Z) direction. The structure of each memory block will be described in detail below with reference to FIGS. 3 and 4.

Figure 3:
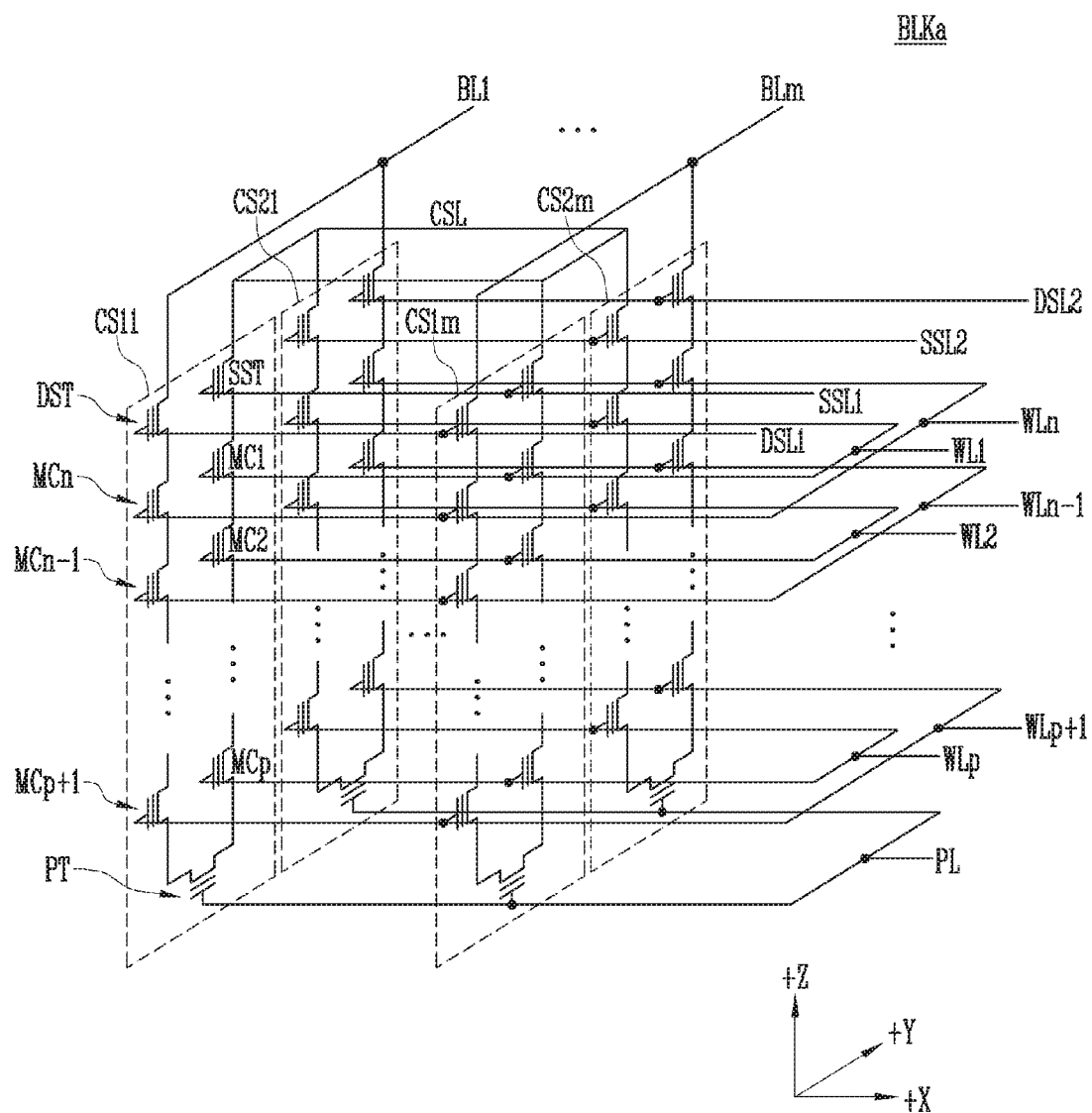
FIG. 3 is a circuit diagram illustrating an embodiment of any one memory block BLKa of memory blocks BLK1 to BLKz of FIG. 2.

FIG. 3 is a circuit diagram illustrating any one memory block BLKa of the memory blocks BLK1 to BLKz of FIG. 2.

Referring to FIG. 3, the memory block BLKa includes a plurality of cell strings CS11 to CS1$m$ and CS21 to CS2$m$. In an embodiment, each of the cell strings CS11 to CS1$m$ and CS21 to CS2$m$ may be formed in a 'U' shape. In the memory block BLKa, m cell strings are arranged in a row direction (i.e., positive (+) X direction). In FIG. 3, two cell strings are illustrated as being arranged in a column direction (i.e., positive (+) Y direction). However, this illustration is made for convenience of description, and it will be understood that three or more cell strings may be arranged in the column direction.

Each of the plurality of cell strings CS11 to CS1$m$ and CS21 to CS2$m$ includes at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided to each cell string. In an embodiment, a pillar for providing at least one of the channel layer, the tunneling insulating layer, the charge storage layer, and the blocking insulating layer may be provided to each cell string.

The source select transistor SST of each cell string is connected between the common source line CSL and memory cells MC1 to MCp.

In an embodiment, the source select transistors of cell strings arranged in the same row are coupled to a source select line extended in a row direction, and source select transistors of cell strings arranged in different rows are coupled to different source select lines. In FIG. 3, source select transistors of cell strings CS11 to CS1$m$ in a first row are coupled to a first source select line SSL1. The source select transistors of cell strings CS21 to CS2$m$ in a second row are coupled to a second source select line SSL2.

In an embodiment, source select transistors of the cell strings CS11 to CS1$m$ and CS21 to CS2$m$ may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite a positive (+) Z direction and are connected in series between the source select transistor SST and the pipe transistor PT. The p+1-th to n-th memory cells MCp+1 to MCn are sequentially arranged in the +Z direction and are connected in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

The gate of the pipe transistor PT of each cell string is coupled to a pipeline PL.

The drain select transistor DST of each cell string is connected between the corresponding bit line and the memory cells MCp+1 to MCn. The cell strings in a row direction are coupled to drain select lines extended in a row direction. Drain select transistors of cell strings CS11 to CS1$m$ in the first row are coupled to a first drain select line DSL1. Drain select transistors of cell strings CS21 to CS2$m$ in a second row are coupled to a second drain select line DSL2.

Cell strings arranged in a column direction are coupled to bit lines extended in a column direction. In FIG. 3, cell strings CS11 and CS21 in a first column are coupled to a first bit line BL1. Cell strings CS1$m$ and CS2$m$ in an m-th column are coupled to an m-th bit line BLm.

The memory cells coupled to the same word line in cell strings arranged in a row direction constitute a single page. For example, memory cells coupled to the first word line WL1, among the cell strings CS11 to CS1$m$ in the first row, constitute a single page. Memory cells coupled to the first word line WL1, among the cell strings CS21 to CS2$m$ in the second row, constitute a single additional page. Cell strings arranged in the direction of a single row may be selected by selecting any one of the drain select lines DSL1 and DSL2. A single page may be selected from the selected cell strings by selecting any one of the word lines WL1 to WLn.

In an embodiment, even bit lines and odd bit lines, instead of first to m-th bit lines BL1 to BLm, may be provided. Further, even-numbered cell strings, among the cell strings CS11 to CS1$m$ or CS21 to CS2$m$ arranged in a row direction, may be coupled to the even bit lines, respectively, and odd-numbered cell strings, among the cell strings CS11 to CS1$m$ or CS21 to CS2$m$ arranged in the row direction, may be coupled to the odd bit lines, respectively.

In an embodiment, one or more of the first to n-th memory cells MC1 to MCn may be used as dummy memory cells. For example, one or more dummy memory cells are provided to reduce an electric field between the source select transistor SST and the memory cells MC1 to MCp. Alternatively, the one or more dummy memory cells are provided to reduce an electric field between the drain select transistor DST and the memory cells MCp+1 to MCn. As more dummy memory cells are provided, the reliability of the operation of the memory block BLKa is improved, but the size of the memory block BLKa is increased. As fewer memory cells are provided, the size of the memory block BLKa is reduced, but the reliability of the operation of the memory block BLKa may be deteriorated.

In order to efficiently control the one or more dummy memory cells, each of the dummy memory cells may have a required threshold voltage. Before or after the erase operation of the memory block BLKa is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 4:
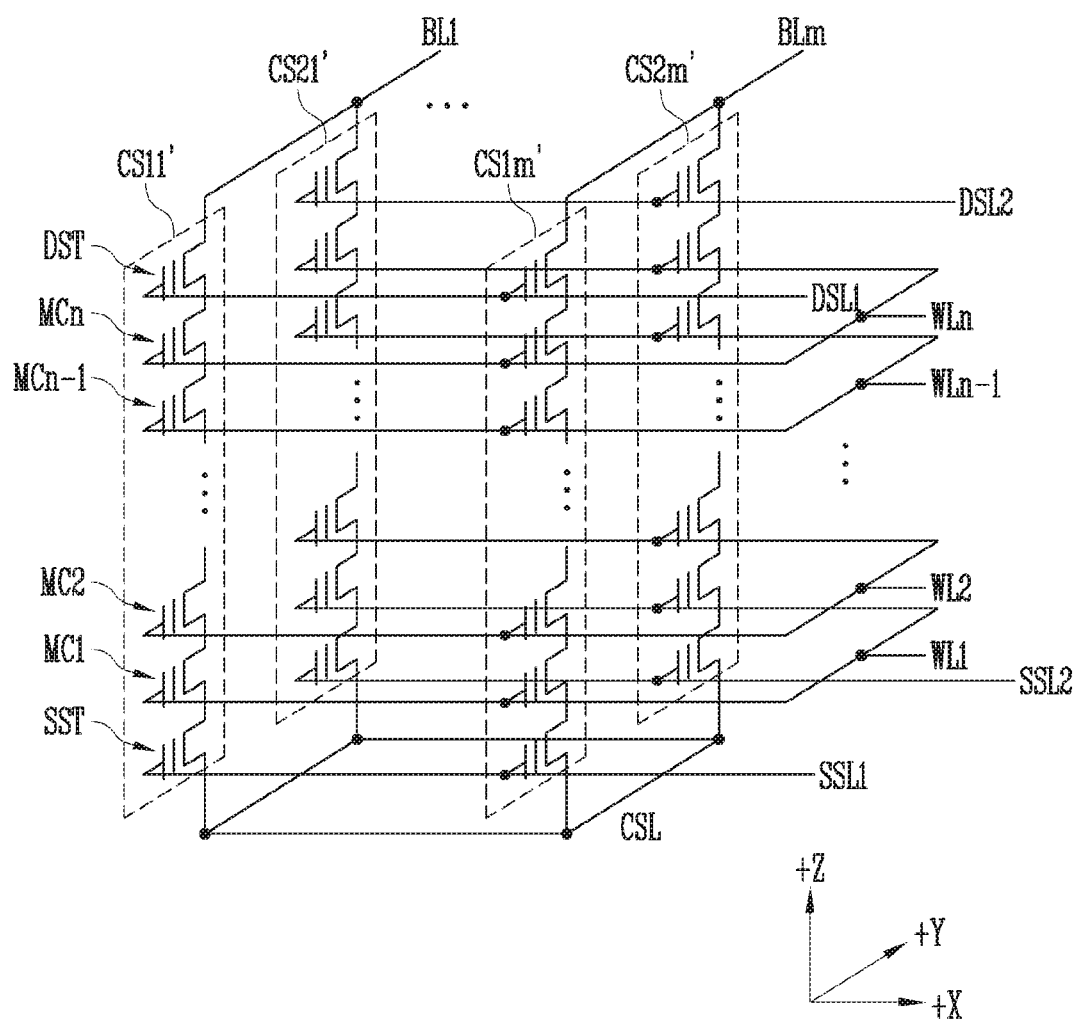
FIG. 4 is a circuit diagram illustrating an embodiment of any one memory block BLKb of the memory blocks BLK1 to BLKz of FIG. 2.

FIG. 4 is a circuit diagram illustrating an example of any one memory block BLKb of the memory blocks BLK1 to BLKz of FIG. 2.

Referring to FIG. 4, the memory block BLKb includes a plurality of cell strings CS11' to CS1$m$' and CS21' to CS2$m$'. Each of the plurality of cell strings CS11' to CS1$m$' and CS21' to CS2$m$' is extended along a positive Z (+Z) direction. Each of the cell strings CS11' to CS1$m$' and CS21' to CS2$m$' includes at least one source select transistor SST, first to n-th memory cells MC1 to MCn, and at least one drain select transistor DST, which are stacked on a substrate (not illustrated) below the memory block BLKb.

The source select transistor SST of each cell string is connected between a common source line CSL and memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are connected in series between the source select transistor SST and the drain select transistor DST. The gates of the first to n-th memory cells MC1 to MCn are coupled to first to n-th word lines WL1 to WLn, respectively.

The drain select transistor DST of each cell string is connected between the corresponding bit line and the memory cells MC1 to MCn. Drain select transistors of cell strings arranged in a row direction are coupled to drain select lines extended in a row direction. The drain select transistors of the cell strings CS11' to CS1m' in the first row are coupled to a first drain select line DSL1. The drain select transistors of the cell strings CS21' to CS2m' in the second row are coupled to a second drain select line DSL2.

As a result, the memory block BLKb of FIG. 4 has an equivalent circuit similar to that of the memory block BLKa of FIG. 3 except that a pipe transistor PT is excluded from each cell string.

In an embodiment, even bit lines and odd bit lines, instead of first to m-th bit lines BL1 to BLm, may be provided. Further, even-numbered cell strings, among the cell strings CS11' to CS1m' or CS21' to CS2m' arranged in a row direction, may be coupled to the even bit lines, respectively, and odd-numbered cell strings, among the cell strings CS11' to CS1m' or CS21' to CS2m' arranged in the row direction, may be coupled to the odd bit lines, respectively.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCn. Alternatively, the one or more dummy memory cells are provided to reduce an electric field between the drain select transistor DST and the memory cells MC1 to MCn. As more dummy memory cells are provided, the reliability of the operation of the memory block BLKb is improved, but the size of the memory block BLKb is increased. As fewer memory cells are provided, the size of the memory block BLKb is reduced, but the reliability of the operation of the memory block BLKb may be deteriorated.

In order to efficiently control the one or more dummy memory cells, each of the dummy memory cells may have a required threshold voltage. Before or after the erase operation of the memory block BLKb is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 5:
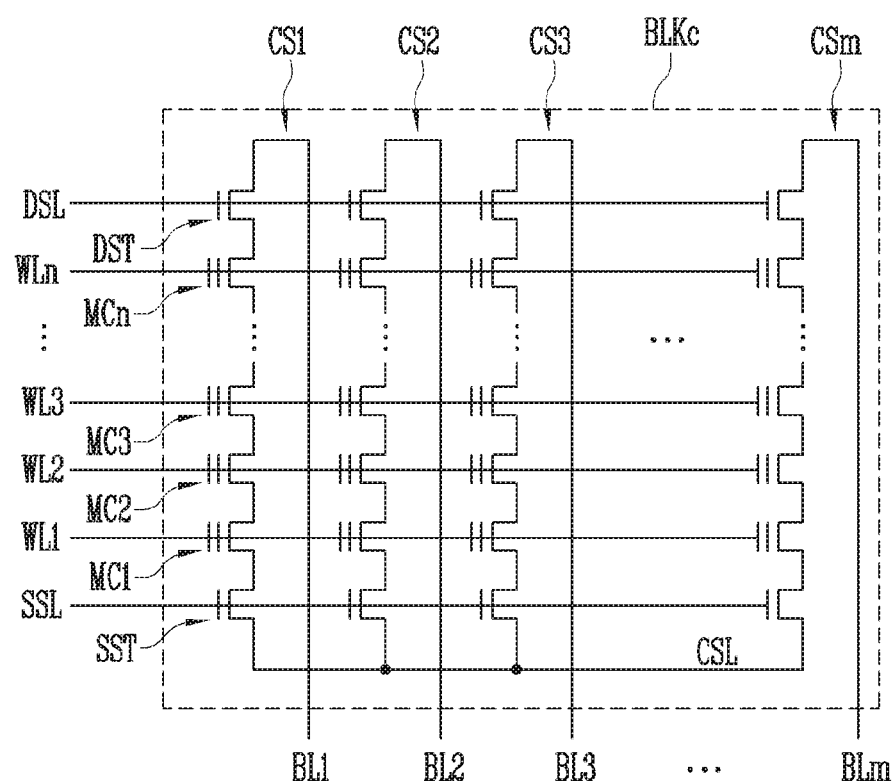
FIG. 5 is a circuit diagram illustrating an embodiment of any one memory block BLKc of a plurality of memory blocks BLK1 to BLKz included in the memory cell array 110 of FIG. 1.

FIG. 5 is a circuit diagram illustrating an example of any one memory block BLKc of the memory blocks BLK1 to BLKz included in the memory cell array 110 of FIG. 1.

Referring to FIG. 5, the memory block BLKc includes a plurality of cell strings CS1 to CSm. The plurality of cell strings CS1 to CSm may be coupled to a plurality of bit lines BL1 to BLm, respectively. Each of the cell strings CS1 to CSm includes at least one source select transistor SST, first to n-th memory cells MC1 to MCn, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and the memory cells MC1 to MCn.

The first to n-th memory cells MC1 to MCn in each cell string are coupled between the source select transistor SST and the drain select transistor DST.

The drain select transistor DST of each cell string is coupled between the corresponding bit line and the memory cells MC1 to MCn.

The memory cells coupled to the same word line may constitute a single page. The cell strings CS1 to CSm may be selected by selecting the drain select line DSL. One page may be selected from the selected cell strings by selecting any one of the word lines WL1 to WLn.

In other embodiments, even bit lines and odd bit lines may be provided instead of the first to m-th bit lines BL1 to BLm. Among the cell strings CS1 to CSm, even-numbered cell strings may be coupled to the even bit lines, respectively, and odd-numbered cell strings may be coupled to the odd bit lines, respectively.

As illustrated in FIGS. 2 to 4, the memory cell array 110 of the semiconductor memory device 100 may be implemented as a memory cell array having a 3D structure. Further, as illustrated in FIG. 5, the memory cell array 110 of the semiconductor memory device 100 may be implemented as a memory cell array having a 2D structure.

FIG. 6 is a diagram explaining a program operation of the semiconductor memory device 100.

Referring to FIG. 6, the program operation of the semiconductor memory device 100 may include a plurality of program loops. That is, the program operation of the semiconductor memory device 100 may include a first program loop, a second program loop, a third program loop, etc. The program operation of the semiconductor memory device 100 may be repeated up to an M-th program loop.

Each program loop may include a precharge phase, a program phase, and a verify phase. The precharge phase may be a phase in which a voltage condition for performing a program operation is set in advance. For example, in the precharge phase, an equalize voltage may be applied to word lines coupled to a program target memory block. By applying the equalize voltage to the word lines coupled to the program target memory block, the channel voltages of cell strings that are negatively boosted may be adjusted.

Meanwhile, in the precharge phase, a precharge voltage may be applied to a common source line. In the program phase, the channel area voltages of program target memory cells may be set to a program permission voltage, for example, 0 V. Meanwhile, in the program phase, the channel area of a program-inhibited memory cell may be boosted. When the common source line is maintained at a low voltage, a phenomenon in which, during the program phase, leakage current is produced from the boosted channel area of the program-inhibited memory cell to the common source line and then a boosting level decreases may occur. This is the cause of the problem of increasing the threshold voltage of the program-inhibited memory cell. As the precharge voltage is applied to the common source line in the precharge phase, the phenomenon in which, during the program phase, leakage current is produced from the boosted channel area of the program-inhibited memory cell to the common source line and then a boosting level decreases may be prevented.

In the program phase, a program voltage may be applied to a word line coupled to program target memory cells, that is, a selected word line, among a plurality of word lines coupled to the program target memory block. The program voltage may be the voltage of increasing the threshold voltages of the program target memory cells, among the memory cells coupled to the selected word line. Meanwhile, a program pass voltage may be applied to unselected word lines that are word lines other than the selected word line, among the plurality of word lines. The program pass voltage may be the voltage of maintaining the threshold voltages of memory cells coupled to the unselected word lines without increasing the threshold voltages.

In the program verify phase, a verify voltage may be applied to the word line coupled to the program target memory cells, that is, the selected word line, among the plurality of word lines coupled to the program target memory block. In a state in which the verify voltage is applied to the selected word line, the page buffers PB1 to PBm of the read and write circuit 130 may determine whether the threshold voltages of the program target memory cells are higher than the verify voltage applied to the selected word line by performing a sensing operation through the bit lines BL1 to BLm. The memory cells having threshold voltages higher than the verify voltage may change the states thereof to program-inhibited memory cells. The memory cells having threshold voltages lower than the verify voltage are maintained in the states of the program-inhibited memory cells.

In this way, when the ratio of program-completed memory cells to the program target memory cells exceeds a certain threshold value during the repetition of program loops, the program operation may be successfully terminated. When the ratio of program-completed memory cells to the program target memory cells does not exceed the certain threshold value even if the program loops are repeated and the maximum program loop, that is, an M-th program loop, is performed, it is determined that the program operation has failed, after which the program operation is terminated.

FIG. 7 is a timing diagram illustrating in detail a part of the program operation illustrated in FIG. 6. Referring to FIG. 7, a verify phase, a precharge phase, and a program phase of some of a plurality of program loops are illustrated. As described above, each program loop may include a precharge phase, a program phase, and a verify phase. Therefore, it can be seen in FIG. 7 that a verify phase of a specific program loop and a precharge phase and a program phase of a next program loop are illustrated. In FIG. 7, the voltage of a word line WL coupled to a selected memory block and the voltage of a common source line CSL during a program operation are illustrated.

At time t1, the verify phase is initiated. Although not illustrated in FIG. 7, it can be seen that a program phase has progressed before time t1. As the verify phase is initiated at time t1, a verify voltage Vvrf is applied to a word line coupled to program target memory cells, that is, a selected word line, among a plurality of word lines coupled to the selected memory block. Meanwhile, a verify pass voltage Vpass1 is applied to unselected word lines that are word lines other than the selected word line, among the word lines coupled to the selected memory block. In a state in which the verify voltage Vvrf is applied to the selected word line, the page buffers PB1 to PBm of the read and write circuit 130 may determine whether the threshold voltages of the program target memory cells are higher than the verify voltage applied to the selected word line by performing a sensing operation through bit lines BL1 to BLm.

At time t2, the verify phase is terminated, and the precharge phase of the next program loop is initiated. In the precharge phase, an equalize voltage Veql may be applied to the word lines coupled to the program target memory block. By applying the equalize voltage Veql to the word lines coupled to the program target memory block, the channel voltages of cell strings that are negatively boosted may be adjusted.

Meanwhile, a precharge voltage Vprc may be applied to the common source line CSL in the precharge phase. In the program phase, the channel area voltages of the program target memory cells may be set to a program permission voltage, for example, 0 V. Meanwhile, in the program phase, the channel area of a program-inhibited memory cell may be boosted. When the common source line CSL is maintained at a low voltage, a phenomenon in which, during the program phase, leakage current is produced from the boosted channel area of the program-inhibited memory cell to the common source line CSL and then a boosting level decreases may occur. This is the cause of the problem of increasing the threshold voltage of the program-inhibited memory cell. As illustrated in FIG. 7, as the precharge voltage Vprc is applied to the common source line CSL in the precharge phase, the phenomenon in which, during the program phase, leakage current is produced from the boosted channel area of the program-inhibited memory cell to the common source line CSL and then a boosting level decreases may be prevented.

At time t3, the precharge phase is terminated, and the program phase is initiated. In the program phase, a program voltage Vpgm may be applied to the word line coupled to the program target memory cells, that is, the selected word line (Selected WL), among the plurality of word lines coupled to the program target memory block. The program voltage Vpgm may be the voltage of increasing the threshold voltages of the program target memory cells, among the memory cells coupled to the selected word line. Meanwhile, a program pass voltage Vpass2 may be applied to unselected word lines (Unselected WLs) that are word lines other than the selected word line, among the plurality of word lines. The program pass voltage Vpass2 may be the voltage of maintaining the threshold voltages of memory cells coupled to the unselected word lines (Unselected WLs) without increasing the threshold voltages. In an embodiment, as illustrated in FIG. 7, the program pass voltage Vpass2 may be applied to all of the selected word line and the unselected word lines at time t3, and the program voltage Vpgm may be applied to the selected word line at time t4.

At time t5, the program phase is terminated. Accordingly, the voltages of the word lines may decrease, and the voltage of the common source line may also decrease. Although not illustrated in FIG. 7, it can be seen that the verify phase will be performed after time t5.

Figure 8:
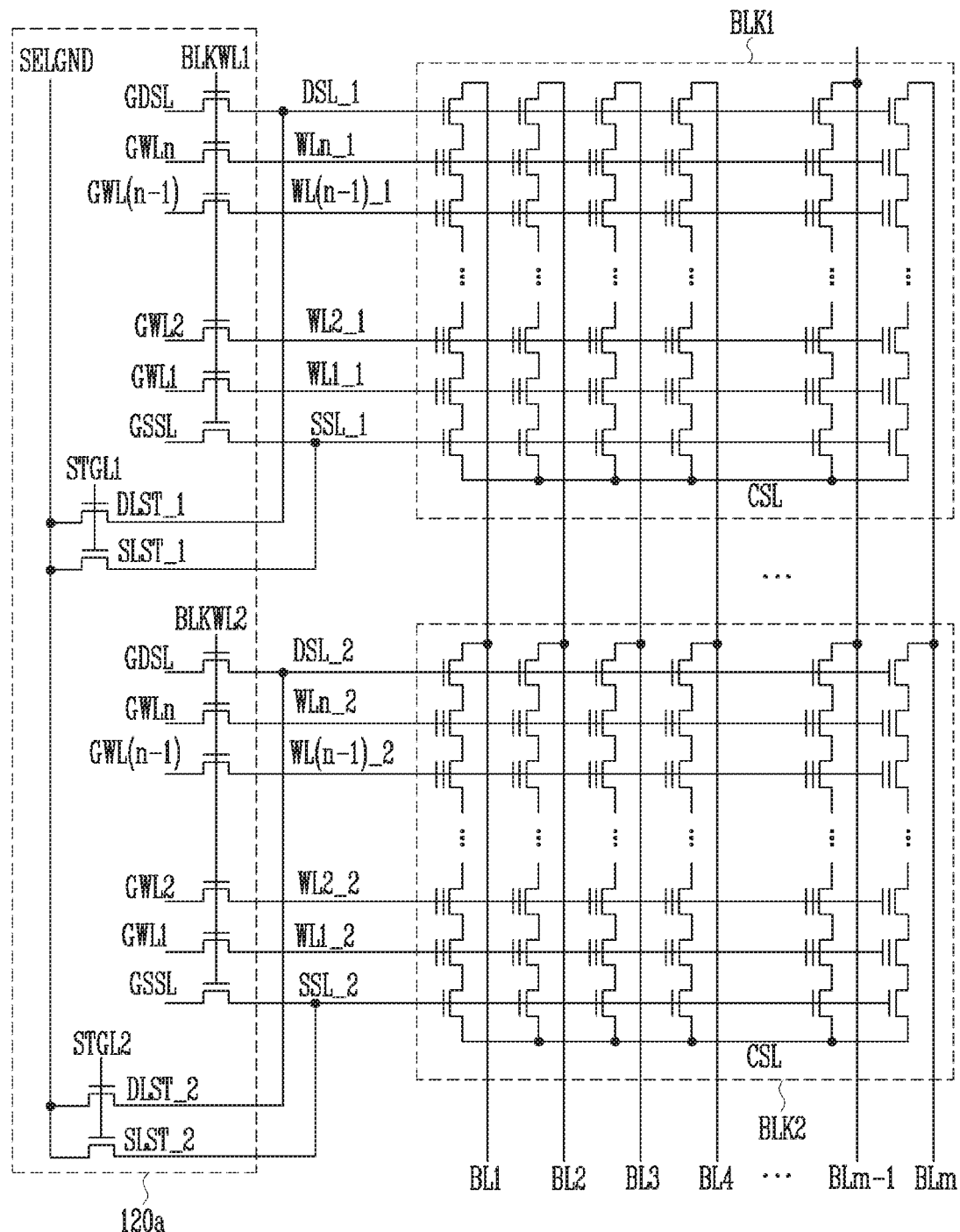
FIG. 8 is a circuit diagram illustrating a coupling structure between memory blocks and an address decoder according to an embodiment of the present disclosure.

FIG. 8 is a circuit diagram illustrating a coupling structure between memory blocks and an address decoder according to an embodiment of the present disclosure.

Referring to FIG. 8, a first memory block BLK1, a second memory block BLK2, and an address decoder 120a are illustrated. In FIG. 8, only two memory blocks are illustrated for convenience of description. The address decoder 120a of FIG. 8 may be an embodiment of the address decoder 120 of FIG. 1. The address decoder 120a may include a first block switch which couples a global drain select line GDSL, global word lines GWL1 to GWLn, and a global source select line GSSL to a drain select line DSL_1, word lines WL1_1 to WLn_1, and a source select line SSL_1 of a first memory block BLK1, respectively. The first block switch may be controlled by a first block word line BLKWL1. Meanwhile, the address decoder 120a may further include a second block switch which couples the global drain select line GDSL, the global word lines GWL1 to GWLn, and the global source select line GSSL to a drain select line DSL_2, word lines WL1_2 to WLn_2, and a source select line SSL_2 of a second memory block BLK2, respectively. The second block switch may be controlled by a second block word line BLKWL2.

Further, the address decoder 120a includes a first drain line select transistor DLST_1 and a first source line select transistor SLST_1 which respectively couple the drain select line DSL_1 and the source select line SSL_1 of the first memory block BLK1 to a selection ground line SELGND. The first drain line select transistor DLST_1 and the first source line select transistor SLST_1 are controlled by a first select transistor ground line STGL1. Meanwhile, the address decoder 120a includes a second drain line select transistor DLST_2 and a second source line select transistor SLST_2 which respectively couple the drain select line DSL_2 and the source select line SSL_2 of the second memory block BLK2 to the selection ground line SELGND. The second drain line select transistor DLST_2 and the second source line select transistor SLST_2 are controlled by a second select transistor ground line STGL2.

Signals that are transferred to the first block word line BLKWL1, the second block word line BLKWL2, the first select transistor ground line STGL1, and the second select transistor ground line STGL2 may be generated by the control logic 140.

The first and second memory blocks BLK1 and BLK2 may be memory blocks, described above with reference to FIGS. 1 to 5. Each memory block includes memory strings coupled to the first to m-th bit lines BL1 to BLm, respectively. The memory strings of the first memory block BLK1 and the memory strings of the second memory block BLK2 are coupled in common to the common source line CSL.

Below, a case where the first memory block BLK1 is a selected memory block that is a program target, and the second memory block BLK2 is an unselected memory block will be described. In addition to the first and second memory blocks illustrated in FIG. 8, a plurality of unselected memory blocks may be present.

During a program operation performed on the first memory block BLK1 that is the selected memory block, a turn-on voltage may be applied to the first block word line BLKWL1 so as to supply various control voltages required for the program operation. Accordingly, the first block switch may be turned on, so that the global drain select line GDSL, the global word lines GWL1 to GWLn, and the global source select line GSSL may be respectively coupled to the drain select line DSL_1, the word lines WL1_1 to WLn_1, and the source select line SSL_1 of the first memory block BLK1. Meanwhile, the second memory block BLK2 that is the unselected memory block may be disabled. For this operation, a turn-off voltage may be applied to the second block word line BLKWL2. Accordingly, the second block switch is turned off, so that the drain select line DSL_2, the word lines WL1_2 to WLn_2, and the source select line SSL_2 of the second memory block BLK2 might not be coupled to the global drain select line GDSL, the global word lines GWL1 to GWLn, and the global source select line GSSL, respectively.

Meanwhile, during the program operation performed on the first memory block BLK1 that is the selected memory block, a turn-off voltage may be applied to the first select transistor ground line STGL1, Accordingly, the first drain line select transistor DLST_1 and the first source line select transistor SLST_1 are turned off. Therefore, the drain select line DSL_1 and the source select line SSL_1 of the first memory block BLK1 are not coupled to the selection ground line. As described above, the drain select line DSL_1 and the source select line SSL_1 are respectively coupled to the global drain select line GDSL and the global source select line GSSL.

Further, during the program operation performed on the first memory block BLK1 that is the selected memory block, a turn-on voltage may be applied to the second select transistor ground line STGL2. Accordingly, the second drain line select transistor DLST_2 and the second source line select transistor SLST_2 are turned on. Therefore, the drain select line DSL_2 and the source select line SSL_2 of the second memory block BLK2 that is the unselected memory block are coupled to the selection ground line SELGND.

During the program operation or a read operation, a ground voltage may be applied to the selection ground line SELGND, Meanwhile, during an erase operation, the selection ground line SELGND may float. A circuit for controlling the selection ground line SELGND will be described later with reference to FIG. 9.

As described above, during the program operation performed on the first memory block BLK1 that is the selected memory block, a ground voltage is applied to the source select line SSL_2 of the second memory block BLK2 that is the unselected memory block through the selection ground line SELGND. Here, an operation of precharging the common source line CSL might not be facilitated due to capacitance between the source select line SSL_2 of the second memory block BLK2 and the common source line CSL. As described above with reference to FIG. 7, there is a need to precharge the common source line CSL during the program operation so as to prevent the phenomenon in which, during the program phase, leakage current is produced from a boosted channel area of a program-inhibited memory cell to the common source line CSL and then a boosting level decreases. However, as the ground voltage is applied to the source select line SSL_2 of the unselected memory block, a capacitance component between the source select line SSL_2 of the unselected memory block and the common source line CSL may interfere with the operation of precharging the common source line CSL. This may be the cause of increasing the time required for the precharging of the common source line.

The capacitance component generated between the source select line SSL_2 of the unselected memory block and the common source line CSL in this way will be described in detail later with reference to FIG. 10.

Figure 9:
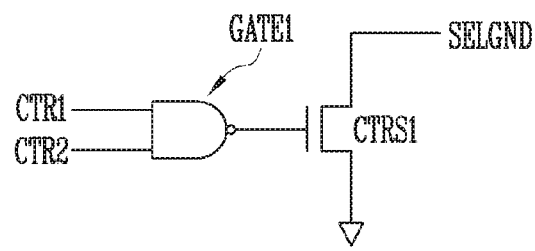
FIG. 9 is a circuit diagram illustrating an embodiment of a circuit for controlling a selection ground line SELGND illustrated in FIG. 8.

FIG. 9 is a circuit diagram illustrating an embodiment of a circuit for controlling the selection ground line SELGND illustrated in FIG. 8.

Referring to FIG. 9, the selection ground line SELGND is controlled by a first control transistor CTRS1. When the first control transistor CTRS1 is turned on, a ground voltage is applied to the selection ground line SELGND. When the first control transistor CTRS1 is turned off, the selection ground line SELGND may float.

The first control transistor CTRS1 is controlled in response to the output of a first gate GATE1. The first gate GATE1 may be a NAND gate. A first control signal CTR1 and a second control signal CTR2 are input to input terminals of the first gate GATE1. In a case where both the first control signal CTR1 and the second control signal CTR2 are signals having a logic value of "1," the first control transistor CTRS1 is turned off. In other cases, that is, in cases where at least one of the first control signal CTR1 and the second control signal CTR2 is a signal having a logic value of "0," the first control transistor CTRS1 is turned on.

The first control signal CTR1 may be a signal which outputs a logic value of "1" when an erase pulse is applied. Meanwhile, the second control signal CTR2 may be a signal which outputs a logic value of "1" when a plane including the corresponding memory block is selected. That is, the selection ground line SELGND may float only when an erase operation is performed on the plane including the corresponding memory block. In other cases, that is, when a program operation or a read operation is performed on the plane including the corresponding memory block, a voltage of "0 V" is applied to the selection ground line SELGND. Also, even in a case where another plane is selected, a voltage of "0 V" is applied to the selection ground line SELGND related to the corresponding plane.

In FIG. 9, the first and second control signals CTR1 and CTR2 applied to the input terminals of the first gate GATE1 may be generated by the control logic 140.

Figure 10:
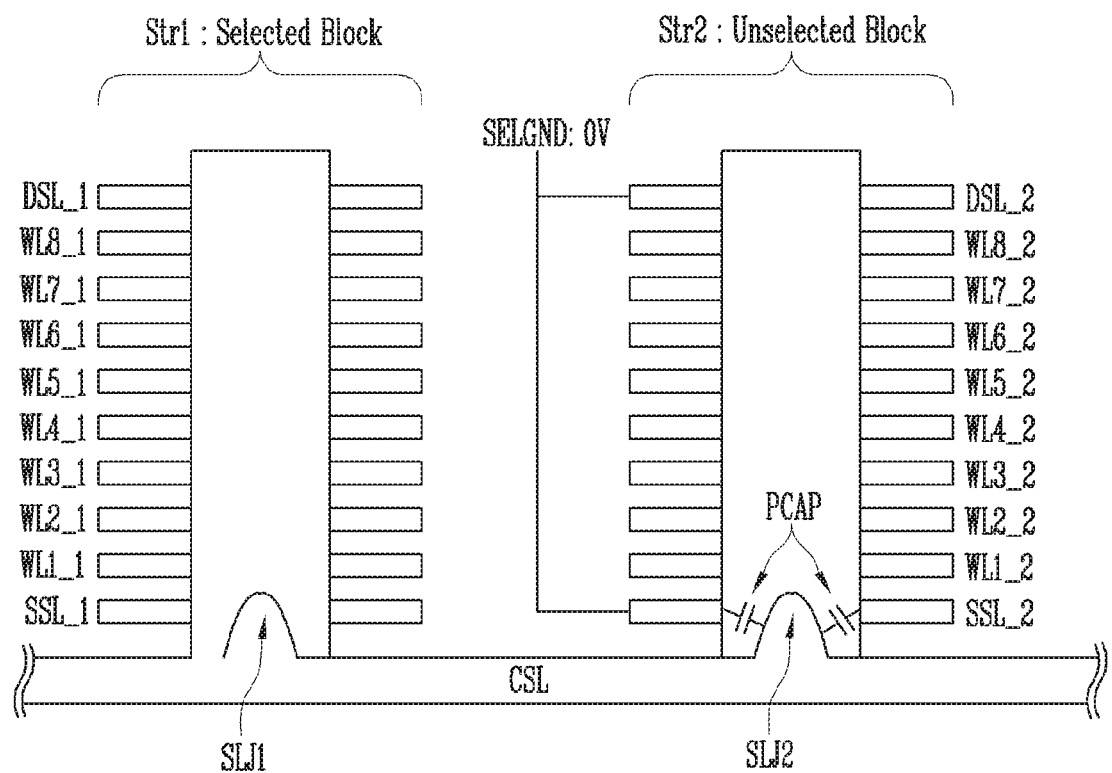
FIG. 10 is a sectional view of memory strings for describing junction capacitance between each source select line and a common source line.

FIG. 10 is a sectional view of memory strings for explaining junction capacitance between each source select line and a common source line. Referring to FIG. 10, for convenience of description, only sectional views of a first string Str1 included in a selected memory block and a second string Str2 included in an unselected memory block are illustrated. Each of the strings Str1 and Str2, illustrated in FIG. 10, may be any one of the strings CS11' to CS1m' and CS21' to CS2m' which are included in the 3D memory block BLKb illustrated in FIG. 4.

Referring to FIG. 10, pillars for configuring the channels of the first string Str1 and the second string Str2 are formed on a common source line CSL, and source select lines SSL_1 and SSL_2, word lines WL1_1 to WL8_1 and WL1_2 to WL8_2, and drain select lines DSL_1 and DSL_2 are formed around respective pillars. In FIG. 10, the illustration of a charge trap layer, a channel layer, and an insulating layer formed therebetween is omitted. Meanwhile, in FIG. 10, an embodiment in which each string is coupled to eight word lines is illustrated. That is, each string illustrated in FIG. 10 may include eight memory cells. However, it can be seen that the embodiment of the present disclosure is not limited thereto, and strings including a variety of numbers of memory cells may be implemented.

Referring to FIG. 10, it can be seen that source line junctions SLJ1 and SLJ2 are formed near junctions between the first and second strings Str1 and Str2 and the common source line CSL. The source line junctions SLJ1 and SLJ2 may be unintentionally formed in a process for forming pillars between the common source line CSL and the respective strings.

As described above, during a program operation performed on a selected memory block, a ground voltage, that is, a voltage of 0 V, may be applied to the drain select line DSL_2 and the source select line SSL_2 of the unselected memory block through the selection ground line SELGND. When the common source line CSL is precharged in a state in which the ground voltage is applied to the source select line SSL_2 of the unselected memory block, the voltage of the common source line CSL may increase slowly, or unnecessary current may be consumed in precharging. When a precharge voltage Vprc is applied to the common source line CSL, unnecessary current may be consumed so as to increase the voltage of the common source line CSL due to parasitic capacitance PCAP formed between the source select line SSL_2 of the unselected memory block and the source line junction SLJ2.

Figure 11:
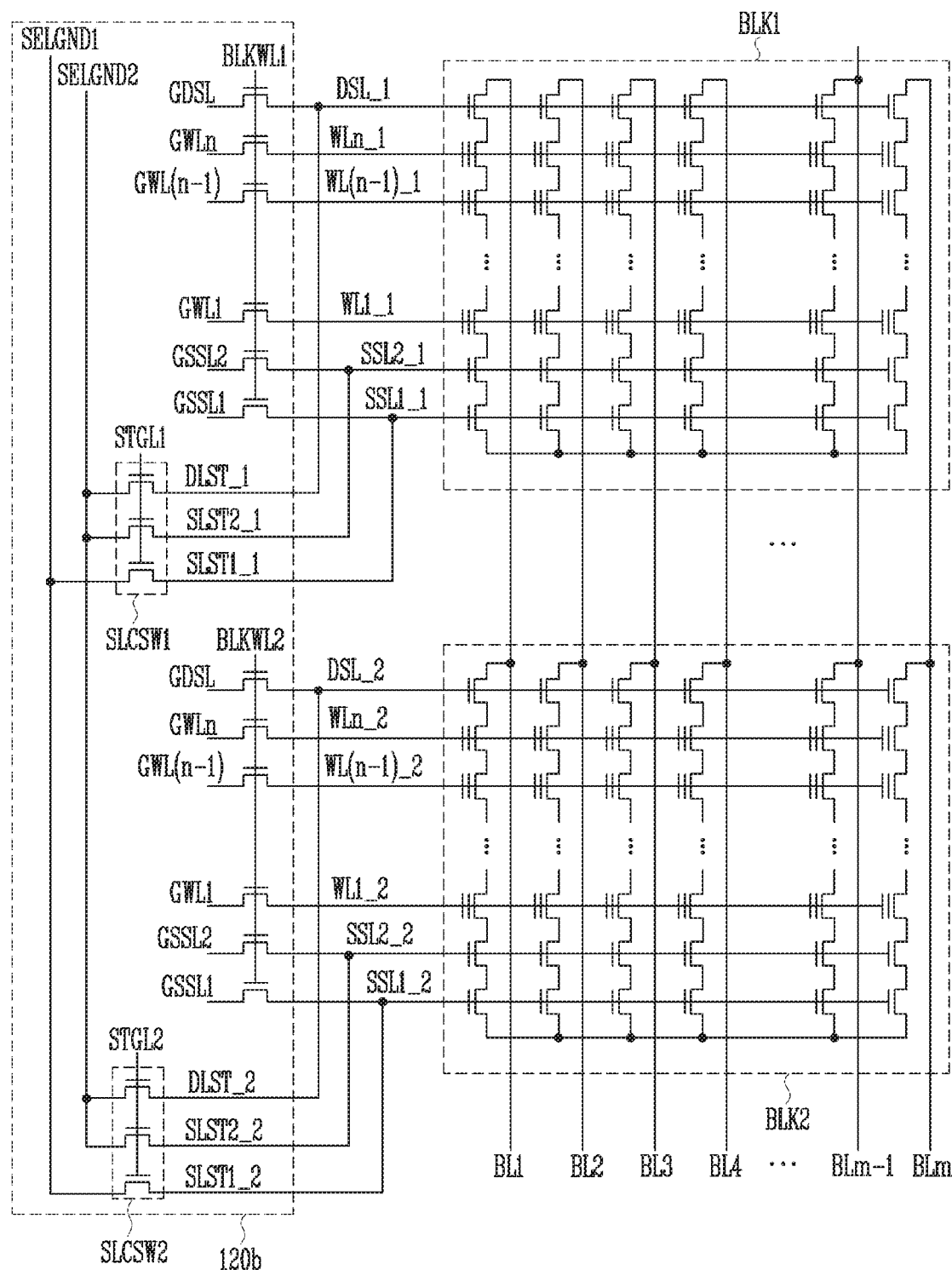
FIG. 11 is a circuit diagram illustrating a coupling structure between memory blocks and an address decoder according to an embodiment of the present disclosure.

FIG. 11 is a circuit diagram illustrating a coupling structure between memory blocks and an address decoder according to an embodiment of the present disclosure.

Referring to FIG. 11, a first memory block BLK1, a second memory block BLK2, and an address decoder 120b are illustrated. In FIG. 11, only two memory blocks are illustrated for convenience of description. The address decoder 120b of FIG. 11 may be an embodiment of the address decoder 120 of FIG. 1. The address decoder 120a may include a first block switch which couples a global drain select line GDSL, global word lines GWL1 to GWLn, and first and second global source select lines GSSL1 and GSSL2 to a drain select line DSL_1, word lines WL1_1 to WLn_1, and first and second source select lines SSL_1 and SSL2_1 of a first memory block BLK1, respectively. The first block switch may be controlled by a first block word line BLKWL1. The address decoder 120b may further include a second block switch which couples the global drain select line GDSL, the global word lines GWL1 to GWLn, and the first and second global source select lines GSSL1 and GSSL2 to a drain select line DSL_2, word lines WL1_2 to WLn_2, and first and second source select lines SSL1_2 and SSL2_2 of a second memory block BLK2, respectively. The second block switch may be controlled by a second block word line BLKWL2.

Also, the address decoder 120b includes a first select line control switch SLCSW1 which couples the drain select line DSL_1, the first source select line SSL1_1, and the second source select line SSL2_1 of the first memory block BLK1 to a first selection ground line SELGND1 and a second selection ground line SELGND2. The first select line control switch SLCSW1 includes a first source line select transistor SLST1_1, a second source line select transistor SLST2_1, and a drain line select transistor DLST_1. The first source line select transistor SLST1_1 couples the first selection ground line SELGND1 to the first source select line SSL1_1 of the first memory block BLK1 under the control of a first select transistor ground line STGL1. The second source line select transistor SLST2_1 couples the second selection ground line SELGND2 to the second source select line SSL2_1 of the first memory block BLK1 under the control of the first select transistor ground line STGL1. The drain line select transistor DLST_1 couples the second selection ground line SELGND2 to the drain select line DSL_1 of the first memory block BLK1 under the control of the first select transistor ground line STGL1.

Also, the address decoder 120b includes a second select line control switch SLCSW2 which couples the drain select line DSL_2, the first source select line SSL1_2, and the second source select line SSL2_2 of the second memory block BLK2 to the first selection ground line SELGND1 and the second selection ground line SELGND2. The second select line control switch SCLSW2 includes a first source line select transistor SLST1_2, a second source line select transistor SLST2_2, and a drain line select transistor DLST_2. The first source line select transistor SLST1_2 couples the first selection ground line SELGND1 to the first source select line SSL1_2 of the second memory block BLK2 under the control of a second select transistor ground line STGL2. The second source line select transistor SLST2_2 couples the second selection ground line SEL-GND2 to the second source select line SSL2_2 of the second memory block BLK2 under the control of the second select transistor ground line STGL2. The drain line select transistor DLST_2 couples the second selection ground line SEL-GND2 to the drain select line DSL_2 of the second memory block BLK2 under the control of the second select transistor ground line STGL2.

During a program operation performed on the first memory block BLK1 that is the selected memory block, a turn-on voltage may be applied to the first block word line BLKWL1 so as to supply various control voltages required for the program operation. Accordingly, the first block switch may be turned on, so that the global drain select line GDSL, the global word lines GWL1 to GWLn, and the first and second global source select lines GSSL1 and GSSL2 may be respectively coupled to the drain select line DSL_1, the word lines WL1_1 to WLn_1, and the first and second source select lines SSL1_1 and SSL2_1 of the first memory block BLK1. Meanwhile, the second memory block BLK2 that is the unselected memory block may be disabled. For this operation, a turn-off voltage may be applied to the second block word line BLKWL2. Accordingly, the second block switch is turned off, so that the drain select line DSL_2, the word lines WL1_2 to WLn_2, and the first and second source select lines SSL1_2 and SSL2_2 of the second memory block BLK2 might not be coupled to the global drain select line GDSL, the global word lines GWL1 to GWLn, and the first and second global source select lines GSSL1 and GSSL2, respectively.

Meanwhile, during a program operation performed on the first memory block BLK1 that is the selected memory block, a turn-off voltage may be applied to the first select transistor ground line STGL1. Accordingly, the first source line select transistor SLST1_1, the second source line select transistor SLST2_1, and the drain line select transistor DLST_1 which are included in the first select line control switch SLCSW1 are turned off. Therefore, the first source select line SSL_1 of the first memory block BLK1 is not coupled to the first selection ground line SELGND1. Further, the second source select line SSL2_1 and the drain select line DSL_1 of the first memory block BLK1 are not coupled to the second select ground line SELGND2.

Further, during the program operation performed on the first memory block BLK1 that is the selected memory block, a turn-on voltage may be applied to the second select transistor ground line STGL2. Accordingly, the first source line select transistor SLST1_2, the second source line select transistor SLST2_2, and the drain line select transistor DLST_2 which are included in the second select line control switch SLCSW2 are turned on. Therefore, the first source select line SSL1_2 of the second memory block BLK2 that is the unselected memory block is coupled to the first select ground line SELGND1. Further, the second source select line SSL2_2 and the drain select line DSL_2 of the second memory block BLK2 are coupled to the second select ground line SELGND2.

During the program operation, the first selection ground line SELGND1 may float, and a ground voltage of 0 V may be applied to the second selection ground line SELGND2. As the first selection ground line SELGGND1 floats, the first source select line SSL1_2 of the second memory block BLK2 that is the unselected memory block also floats. As the ground voltage of 0 V is applied to the second selection ground line SELGND2, the ground voltage of 0 V is applied to the second source select line SSL2_2 and the drain select line DSL_2 of the second memory block BLK2.

Because the first source select line SSL1_2 of the unselected memory block floats during the program operation of the selected memory device, precharging of the common source line may be performed. In detail, because, in the precharge phase, among the precharge phase, the program phase, and the verify phase which are included in each of the plurality of program loops, the first source select line SSL1_2 of the unselected memory block floats during the program operation, the influence of parasitic capacitance between the source line junctions of the first source select line SSL1_2 of the unselected memory block and the common source line may be minimized.

Figure 12:
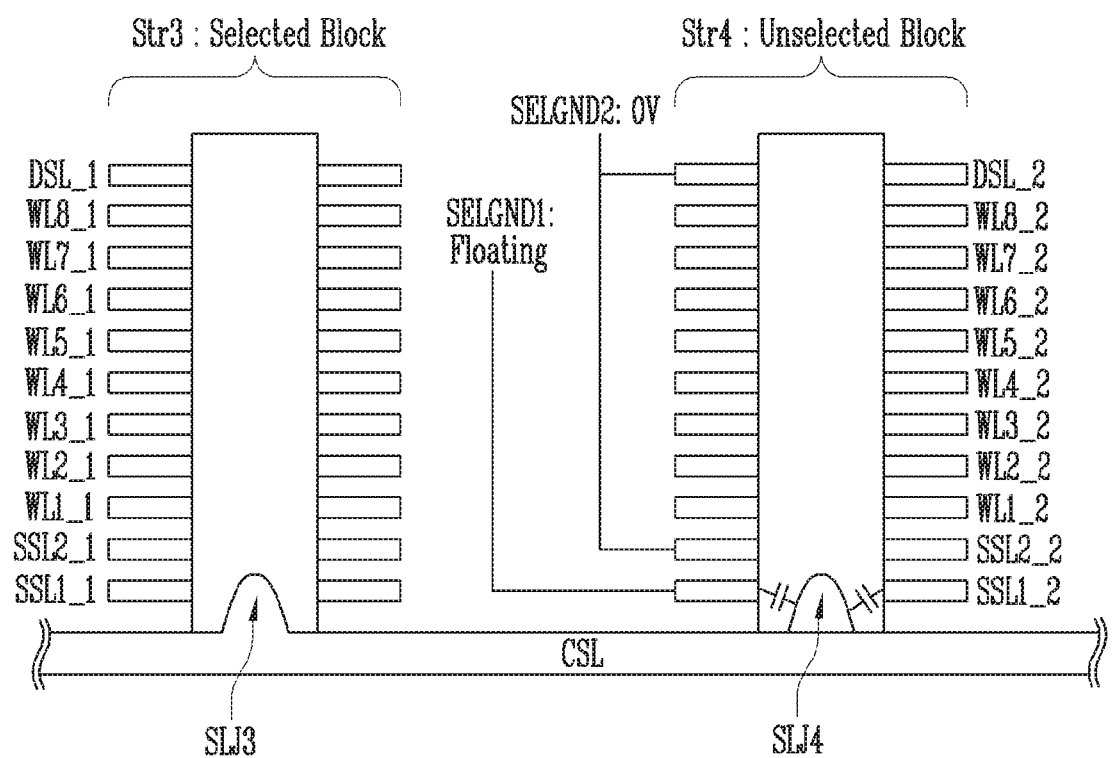
FIG. 12 is a sectional view of memory strings for describing junction capacitance between each source select line and a common source line according to the embodiment of FIG. 11.

FIG. 12 is a sectional view of memory strings for explaining junction capacitance between each source select line and a common source line according to the embodiment of FIG. 11.

Referring to FIG. 12, for convenience of description, only sectional views of a third string Str3 included in a selected memory block and a fourth string Str4 included in an unselected memory block are illustrated. The strings Str3 and Str4 illustrated in FIG. 12 have a structure similar to that of the strings Str1 and Str2 illustrated in FIG. 10. However, each of the strings Str3 and Str4 illustrated in FIG. 12 is coupled to two source select lines.

Referring to FIG. 12, pillars for configuring the channels of the third string Str3 and the fourth string Str4 are formed on a common source line CSL, and first source select lines SSL1_1 and SSL1_2, second source select lines SSL2_1 and SSL2_2, word lines WL1_1 to WL8_1 and WL1_2 to WL8_2, and drain select lines DSL_1 and DSL_2 are formed around the respective pillars. In FIG. 12, the illustration of a charge trap layer, a channel layer, and an insulating layer formed therebetween is omitted. Meanwhile, in FIG. 12, an embodiment in which each string is coupled to eight word lines is illustrated.

Referring to FIG. 12, it can be seen that source line junctions SLJ3 and SLJ4 are formed near junctions between the third and fourth strings Str3 and Str4 and the common source line CSL. The source line junctions SLJ3 and SLJ4 may be unintentionally formed in a process for forming pillars between the common source line CSL and the respective strings.

As described above, during a program operation performed on a selected memory block, a ground voltage, that is, a voltage of 0 V, may be applied to the drain select line DSL_2 and the second source select line SSL2_2 of an unselected memory block through a second selection ground line SELGND2. Also, the first source select line SSL1_2 of the unselected memory block may float together with a first selection ground line SELGND1.

Accordingly, even if the common source line CSL is precharged, the potential of the first source select line SSL1_2 of the unselected memory block may also increase due to parasitic capacitance PCAP. Therefore, a phenomenon in which precharge speed decreases or in which unnecessary current is consumed due to the influence of the first source select line SSL1_2 may be mitigated. Although parasitic capacitance may also be formed between the second source select line SSL2_2 and the source line junction SLJ4, the second source select line SSL2_2 is disposed farther away from the source line junction SLJ4 than the first source select line SSL1_2, and thus the influence of the parasitic capacitance is not large.

Therefore, in accordance with a semiconductor memory device according to an embodiment of the present disclosure, in a common source line precharge phase for the program operation performed on the selected memory block, a source select line disposed adjacent to the common source line, among a plurality of source select lines coupled to the unselected memory block, floats. Accordingly, the influence of parasitic capacitance between the source select line disposed adjacent to the common source line, among the source select lines of the unselected memory block, and a source line junction may be minimized, thus smoothly performing the operation of precharging the common source line.

In the embodiments illustrated in FIGS. 11 and 12, each memory block is illustrated as being coupled to two source select lines. That is, each of the first memory block BLK1 and the second memory block BLK2 is illustrated as being coupled to the first source select line SSL1_1 or SSL1_2 and the second source select line SSL2_1 or SSL2_2. However, the semiconductor memory device according to an embodiment of the present disclosure is not limited thereto, and thus three or more source select lines may be coupled to each memory block. In this case, when the common source line CSL is precharged, at least two of the source select lines coupled to the unselected memory block may float. The plurality of source select lines that are floating may be source select lines disposed adjacent to the common source line CSL. Meanwhile, when the common source line CSL is precharged, a voltage of 0 V may be applied to at least two of the source select lines coupled to the unselected memory block. The source select lines to which a voltage of 0 V is applied may be source select lines disposed adjacent to the memory cells.

Figure 13A:
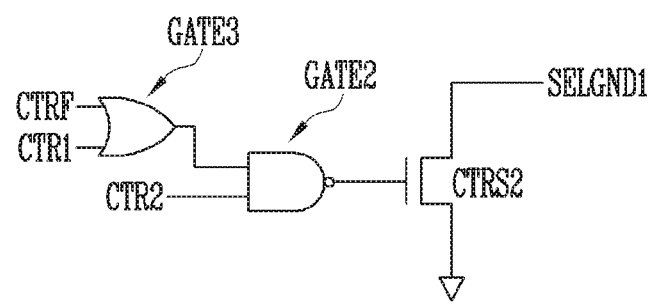
FIGS. 13A and 13B are circuit diagrams illustrating an embodiment of a circuit for controlling first and second selection ground lines SELGND1 and SELGND2 illustrated in FIG. 11.
Figure 13B:
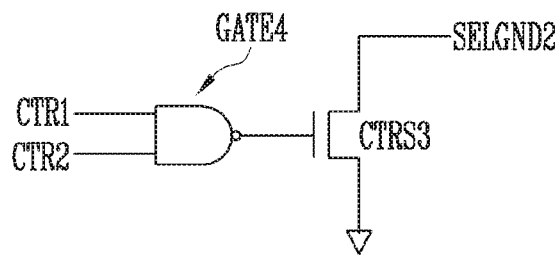

FIGS. 13A and 13B are circuit diagrams illustrating an embodiment of a circuit for controlling the first and second selection ground lines SELGND1 and SELGND2 illustrated in FIG. 11.

Referring to FIG. 13A, the first selection ground line SELGND1 is controlled by a second control transistor CTRS2. When the second control transistor CTRS2 is turned on, a ground voltage is applied to the first selection ground line SELGND1. When the second control transistor CTRS2 is turned off, the first selection ground line SELGND1 floats.

The second control transistor CTRS2 is controlled in response to the output of a second gate GATE2. The second gate GATE2 may be a NAND gate. An output signal of a third gate GATE3 and a second control signal CTR2 are applied to input terminals of the second gate GATE2. Meanwhile, the third gate GATE3 may be an OR gate. A first control signal CTR1 and a floating control signal CTRF may be applied to input terminals of the third gate GATE3.

In a case where both the output signal of the third gate GATE3 and the second control signal CTR2 are signals having a logic value of "1," the second control transistor CTRS2 is turned off. In other cases, that is, in cases where at least one of the output signal of the third gate GATE3 and the second control signal CTR2 is a signal having a logic value of "0," the second control transistor CTRS2 is turned on.

The first control signal CTR1 may be a signal which outputs a logic value of "1" when an erase pulse is applied. Meanwhile, the floating control signal CTRF may be a signal which outputs a logic value of "1" in order for the first selection ground line SELGND1 to float in a situation other than that of the erase operation. Meanwhile, the second control signal CTR2 may be a signal which outputs a logic value of "1" when a plane including the corresponding memory block is selected.

That is, during an erase operation performed on the plane including the corresponding memory block, the first selection ground line SELGND1 floats. Also, the first selection ground line SELGND1 may float even when the floating control signal CTRF is activated to "1" in operations other than the erase operation.

Referring to FIG. 13B, the second selection ground line SELGND2 is controlled by a third control transistor CTRS3. When the third control transistor CTRS3 is turned on, a ground voltage is applied to the second selection ground line SELGND2. When the third control transistor CTRS3 is turned off, the second selection ground line SELGND2 floats. Because the circuit of FIG. 13B is configured to be substantially the same as the circuit of FIG. 9, a repeated description thereof will be omitted.

During a program operation performed on the first memory block BLK1 illustrated in FIG. 11, the first control signal CTR1 may indicate a logic value of "0," the second control signal CTR2 may indicate a logic value of "1," and the floating control signal CTRF may indicate a logic value of "1." During the program operation, the first selection ground line SELGND1 floats, and a voltage of 0 V is transferred to the second selection ground line SELGND2. Accordingly, as illustrated in FIG. 12, the first source select line SSL1_2 coupled to strings of the unselected memory block floats.

Therefore, in accordance with a semiconductor memory device according to an embodiment of the present disclosure, in a common source line precharge phase for the program operation performed on the selected memory block, a source select line disposed adjacent to the common source line, among a plurality of source select lines coupled to the unselected memory block, floats. Accordingly, the influence of parasitic capacitance between the source select line disposed adjacent to the common source line, among the source select lines of the unselected memory block, and a source line junction may be minimized, thus smoothly performing the operation of precharging the common source line.

Figure 14:
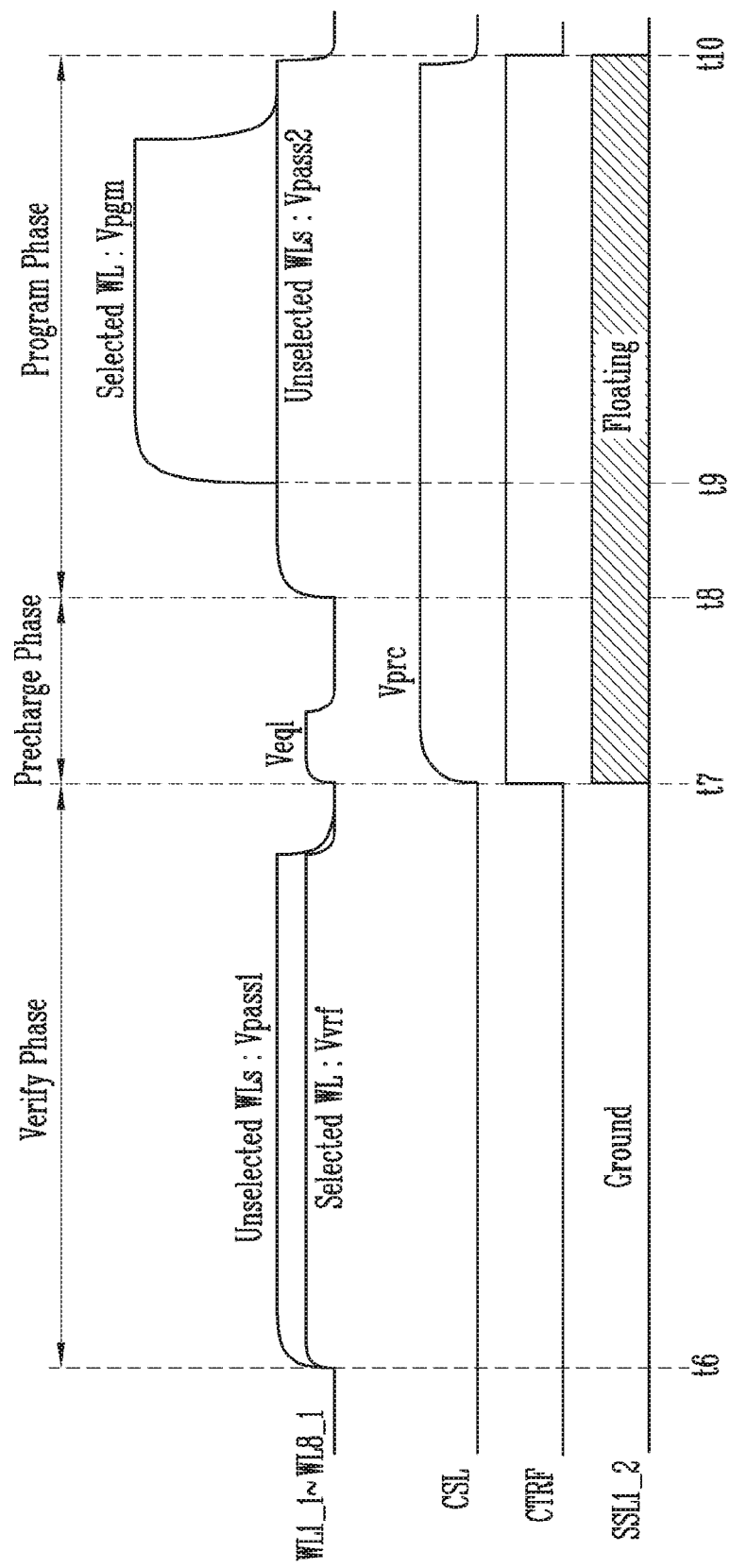
FIG. 14 is a timing diagram illustrating in detail a part of a program operation according to an embodiment of the present disclosure.

FIG. 14 is a timing diagram illustrating in detail a part of a program operation according to an embodiment of the present disclosure.

Referring to FIG. 14, a verify phase, a precharge phase, and a program phase of some of a plurality of program loops are illustrated. As described above with reference to FIG. 6, one program loop may include a precharge phase, a program phase, and a verify phase. Therefore, it can be seen in FIG. 14 that a verify phase of a specific program loop and a precharge phase and a program phase of a next program loop are illustrated. In FIG. 14, during the program operation, the voltage of a word line WL coupled to a selected memory block, the voltage of a common source line CSL, a floating control signal CTRF, and the voltage of a first source select line SSL1_2 of an unselected memory block are illustrated.

At time t6, the verify phase is initiated. Although not illustrated in FIG. 14, it can be seen that a program phase has progressed before time t6. As the verify phase is initiated at time t6, a verify voltage Vvrf is applied to a word line coupled to program target memory cells, that is, a selected word line, among a plurality of word lines coupled to the selected memory block. Meanwhile, a verify pass voltage Vpass1 is applied to unselected word lines that are word lines other than the selected word line, among the word lines coupled to the selected memory block. In a state in which the verify voltage Vvrf is applied to the selected word line, the page buffers PB1 to PBm of the read and write circuit 130 may determine whether the threshold voltages of the program target memory cells are higher than the verify voltage applied to the selected word line by performing a sensing operation through bit lines BL1 to BLm. Meanwhile, in the verify phase, the floating control signal CTRF may indicate a value of "0." Further, in the verify phase, a ground voltage of 0 V may be applied to the common source line. Furthermore, in the verify phase, a ground voltage of 0 V may be applied to the first source select line SSL1_2 of the unselected memory block. Further, in the verify phase, the second source select line SSL2_2 coupled to the unselected memory block may be grounded.

At time t7, the verify phase is terminated, and the precharge phase of a next program loop is initiated. In the precharge phase, an equalize voltage Veql may be applied to the word lines coupled to the program target memory block. By applying the equalize voltage Veql to the word lines coupled to the program target memory block, channel voltages of cell strings that are negatively boosted may be adjusted.

In accordance with an embodiment of the present disclosure, in the precharge phase, the floating control signal CTRF may change to a value of "1" at time t7. Accordingly, by means of the circuit illustrated in FIG. 13A, the first selection ground line SELGND1 floats. Meanwhile, a precharge voltage Vprc may be applied to the common source line CSL in the precharge phase. Because the first selection ground line SELGND1 floats and the first source select line SSL1_2 of the unselected memory block also floats, the operation of precharging the common source line CSL may smoothly progress.

At time t8, the precharge phase is terminated and the program phase is initiated. In the program phase, a program voltage Vpgm may be applied to the word line coupled to the program target memory cells, that is, the selected word line (Selected WL), among the plurality of word lines coupled to the program target memory block. The program voltage Vpgm may be the voltage of increasing the threshold voltages of the program target memory cells, among the memory cells coupled to the selected word line. Meanwhile, a program pass voltage Vpass2 may be applied to unselected word lines (Unselected WLs) that are word lines other than the selected word line, among the plurality of word lines. The program pass voltage Vpass2 may be the voltage of maintaining the threshold voltages of memory cells coupled to the unselected word lines (Unselected WLs) without increasing the threshold voltages. In an embodiment, as illustrated in FIG. 14, the program pass voltage Vpass2 may be applied to all of the selected word line and the unselected word lines at time t8, and the program voltage Vpgm may be applied to the selected word line at time t9. Meanwhile, in the program phase, the first source select line SSL1_2 coupled to the unselected memory block may remain floating.

At time t10, the program phase is terminated. Accordingly, the voltages of the word lines may decrease, and the voltage of the common source line may also decrease. Although not illustrated in FIG. 14, it can be seen that the verify phase will be performed after time t10.

Figure 15:
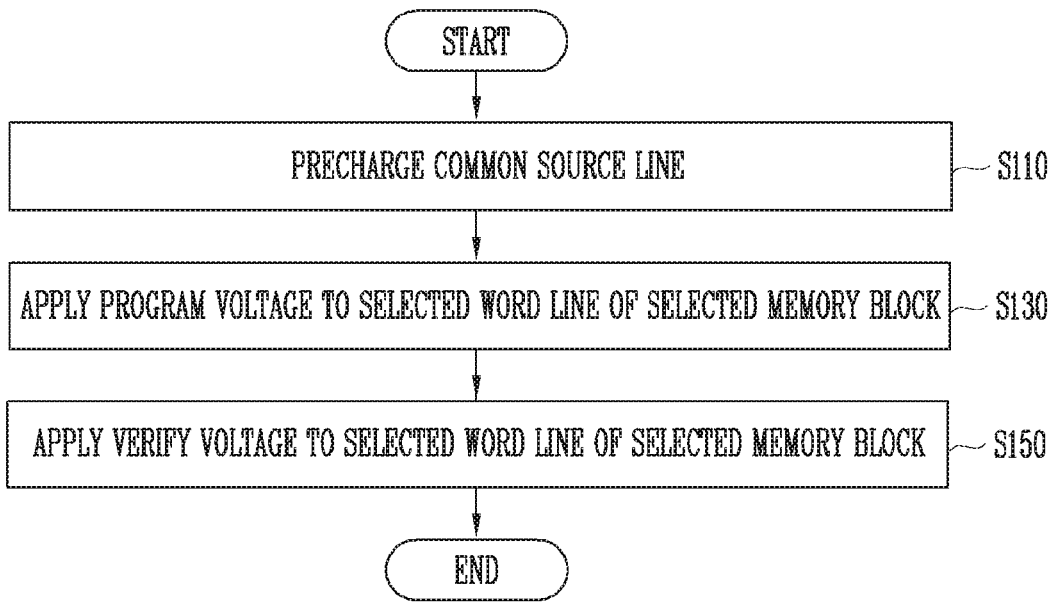
FIG. 15 is a flowchart illustrating a method of operating a semiconductor memory device according to an embodiment of the present disclosure.

FIG. 15 is a flowchart illustrating a method of operating a semiconductor memory device according to an embodiment of the present disclosure. Referring to FIG. 15, the method of operating the semiconductor memory device may include the step S110 of precharging a common source line, the step S130 of applying a program voltage to a selected word line of a selected memory block, and the step S150 of applying a verify voltage to the selected word line of the selected memory block.

Referring to FIG. 15 together with FIG. 14, step S110 corresponds to the precharge phase of FIG. 14, step S130 corresponds to the program phase of FIG. 14, and step S150 corresponds to the verify phase of FIG. 14.

Therefore, it can be seen at step S110 that a precharge voltage Vprc is applied to the common source line CSL in a state in which the first source select line SSL1_2 coupled to the unselected memory block floats. A detailed embodiment of step S110 will be described below with reference to FIG. 16.

Meanwhile, at step S130, a program pass voltage Vpass2 is applied to the unselected word line at the same time that a program voltage Vpgm is applied to the selected word line of the selected memory block.

At step S150, a verify pass voltage Vpass1 is applied to the unselected word line at the same time that a verify voltage Vvrf is applied to the selected word line of the selected memory block.

Figure 16:
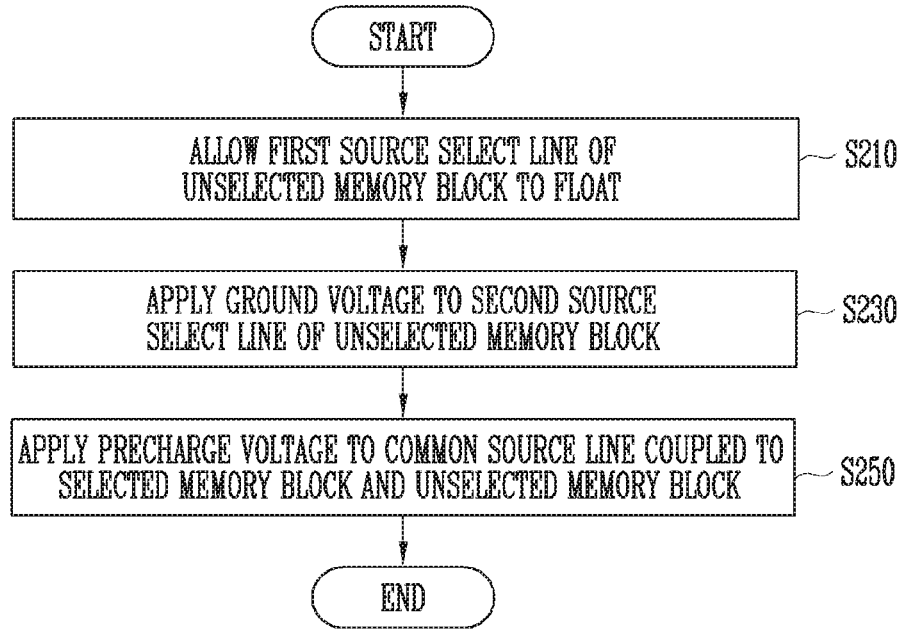
FIG. 16 is a flowchart illustrating in detail step S110 of FIG. 15.

FIG. 16 is a flowchart illustrating in detail step S110 of FIG. 15.

Referring to FIG. 16, step S110 of precharging the common source line CSL, illustrated in FIG. 15, may include the step S210 of allowing the first source select line SSL1_2 of the unselected memory block to float, the step S230 of applying a ground voltage to the second source select line SSL2_2 of the unselected memory block, and the step S250 of applying a precharge voltage Vprc to the common source line CSL coupled to the selected memory block and the unselected memory block.

In FIG. 16, step S230 is illustrated as being performed after step S210 has been performed. However, this operation is merely an example, and thus step S210 may be performed after step S230 has been performed, or steps S210 and S230 may be simultaneously performed.

Figure 17:
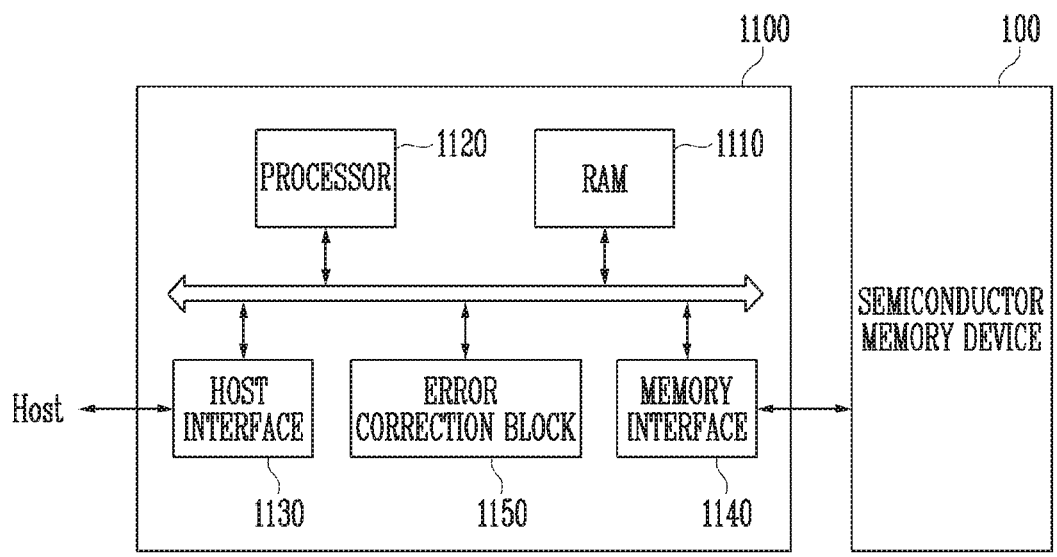
FIG. 17 is a block diagram illustrating a memory system 1000 including the semiconductor memory device 100 of FIG. 1.

FIG. 17 is a block diagram illustrating a memory system 1000 including the semiconductor memory device 100 of FIG. 1.

Referring to FIG. 17, the memory system 1000 includes the semiconductor memory device 100 and a memory controller 1100. The semiconductor memory device 100 may be the semiconductor memory device described with reference to FIG. 1. Hereinafter, repetitive explanations will be omitted.

The memory controller 1100 is coupled to a host Host and the semiconductor memory device 100. The memory controller 1100 may access the semiconductor memory device 100 in response to a request from the host Host. For example, the memory controller 1100 may control read, write, erase, and background operations of the semiconductor memory device 100. The memory controller 1100 may provide an interface between the semiconductor memory device 100 and the host Host. The memory controller 1100 may run firmware for controlling the semiconductor memory device 100.

The memory controller 1100 includes a random access memory (RAM) 1110, a processor 1120, a host interface 1130, a memory interface 1140, and an error correction block 1150. The RAM 1110 is used as at least one of a working memory for the processor 1120, a cache memory between the semiconductor memory device 100 and the host, and a buffer memory between the semiconductor memory device 100 and the host. The processor 1120 may control the overall operation of the memory controller 1100. In addition, the memory controller 1100 may temporarily store program data provided from the host Host during a write operation.

The host interface 1130 includes a protocol for performing data exchange between the host Host and the memory controller 1100. In an embodiment, the memory controller 1100 may communicate with the host Host through at least one of various interface protocols, such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface may include a NAND interface or NOR interface.

The error correction block 1150 may detect and correct errors in data received from the semiconductor memory device 100 using an error correction code (ECC). In an embodiment, the error correction block may be provided as an element of the memory controller 1100.

The memory controller 1100 and the semiconductor memory device 100 may be integrated into a single semiconductor device. In an embodiment, the memory controller 1100 and the semiconductor memory device 100 may be integrated into a single semiconductor device to form a memory card. For example, the memory controller 1100 and the semiconductor memory device 100 may be integrated into a single semiconductor device to form a memory card, such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

The memory controller 1100 and the semiconductor memory device 100 may be integrated into a single semiconductor device to form a solid state drive (SSD). The SSD includes a storage device configured to store data in a semiconductor memory. When the memory system 1000 is used as the SSD, an operation speed of the host Host coupled to the memory system 1000 may be remarkably improved.

In an embodiment, the memory system 1000 may be provided as one of various elements of an electronic device such as a computer, an ultra mobile PC (UMPC), a workstation, a net-book, a personal digital assistant (PDA), a portable computer, a web tablet, a wireless phone, a mobile phone, a smartphone, an e-book, a portable multimedia player (PMP), a game console, a navigation device, a black box, a digital camera, a three-dimensional (3D) television, a digital audio recorder, a digital audio player, a digital picture recorder, a digital picture player, a digital video recorder, a digital video player, a device capable of transmitting/receiving information in an wireless environment, one of various electronic devices for forming a home network, one of various electronic devices for forming a computer network, one of various electronic devices for forming a telematics network, a radio frequency identification (RFID) device, or one of various elements for forming a computing system.

In an embodiment, the semiconductor memory device 100 or the memory system 1000 may be mounted in various types of packages. For example, the semiconductor memory device 100 or the memory system 1000 may be packaged and mounted in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), or Wafer-Level Processed Stack Package (WSP).

Figure 18:
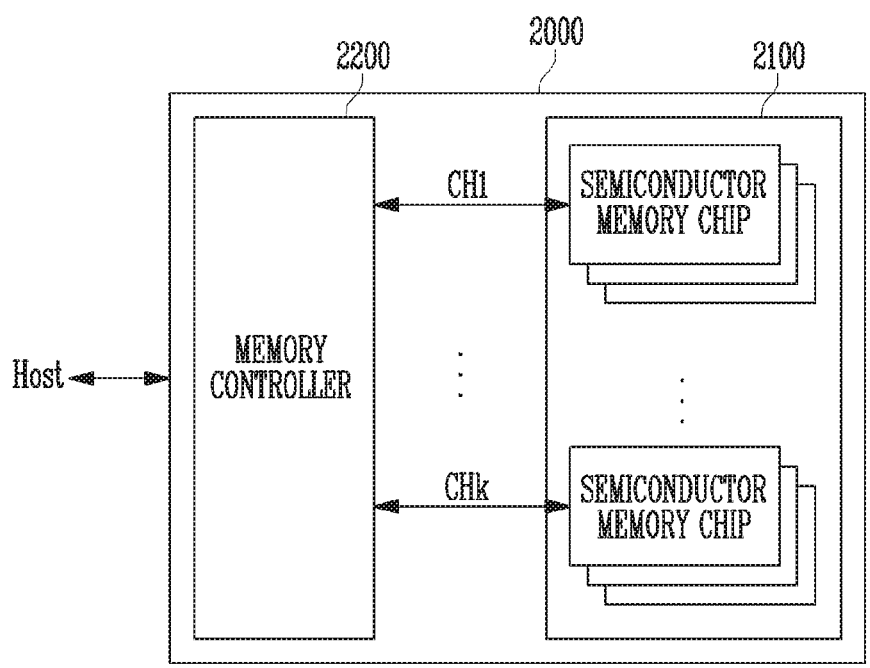
FIG. 18 is a block diagram illustrating an example of application of the memory system of FIG. 17.

FIG. 18 is a block diagram illustrating an application example of the memory system of FIG. 17.

Referring to FIG. 18, the memory system 2000 includes a semiconductor memory device 2100 and a memory controller 2200. The semiconductor memory device 2100 may include a plurality of semiconductor memory chips. The semiconductor memory chips are divided into a plurality of groups.

In FIG. 18, it is illustrated that the plurality of groups communicate with the memory controller 2200 through first to k-th channels CH1 to CHk. Each semiconductor memory chip may be configured and operated in the same manner as those of the semiconductor memory device 100 described with reference to FIG. 1.

Each group may communicate with the memory controller 2200 through one common channel. The memory controller 2200 may have the same configuration as the memory controller 1100 described with reference to FIG. 17, and may control the plurality of memory chips of the semiconductor memory device 2100 through the plurality of channels CH1 to CHk.

Figure 19:
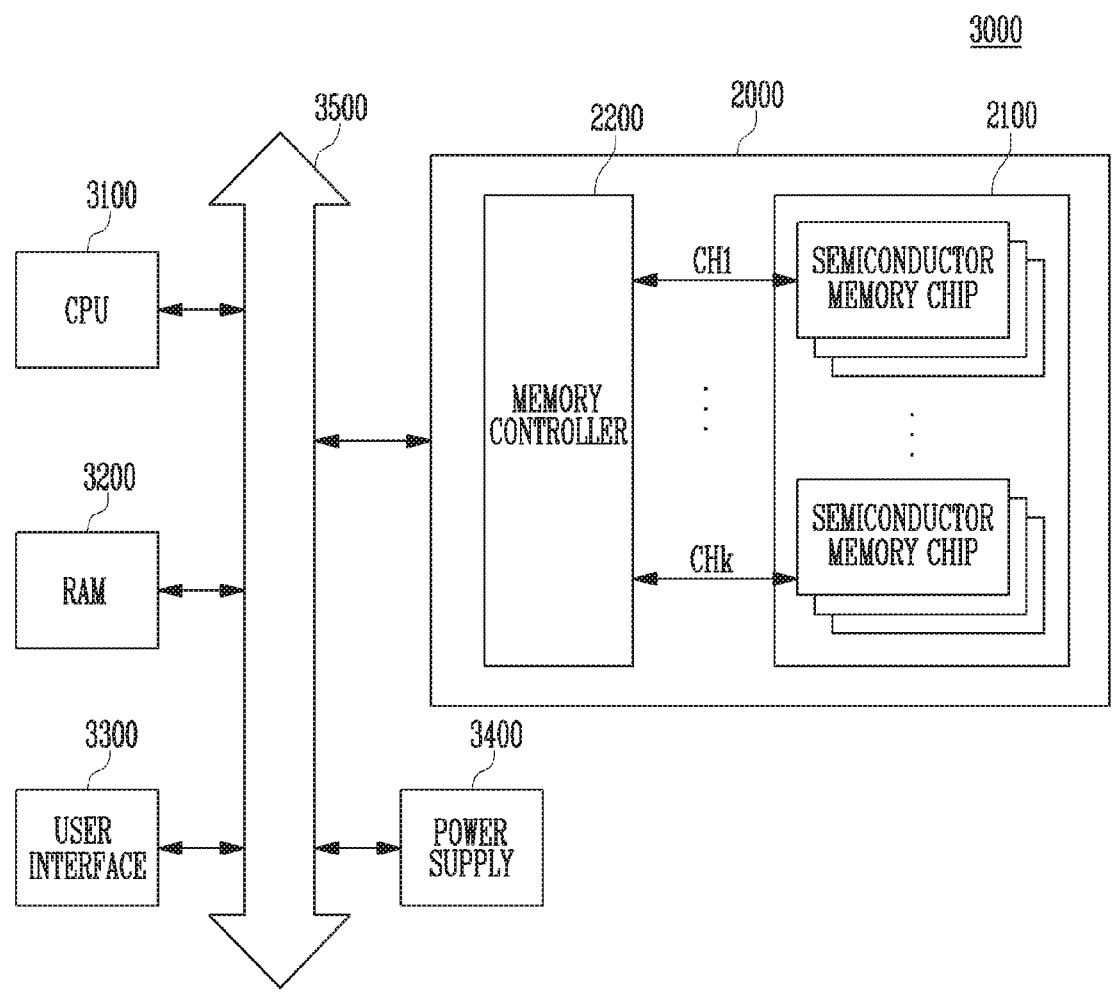
FIG. 19 is a block diagram illustrating a computing system including the memory system described with reference to FIG. 18.

FIG. 19 is a block diagram showing a computing system 3000 including the memory system 2000 illustrated with reference to FIG. 18.

The computing system 3000 includes a central processing unit (CPU) 3100, a RAM 3200, a user interface 3300, a power supply 3400, a system bus 3500, and the memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 19, a semiconductor memory device 2100 is illustrated as being coupled to the system bus 3500 through the memory controller 2200. However, the semiconductor memory device 2100 may be directly coupled to the system bus 3500. Here, the function of the memory controller 2200 may be performed by the CPU 3100 and the RAM 3200.

In FIG. 19, the memory system 2000 described with reference to FIG. 18 is illustrated as being provided. However, the memory system 2000 may be replaced with the memory system 1000 described with reference to FIG. 17. In an embodiment, the computing system 3000 may include both the memory systems 1000 and 2000 described with reference to FIGS. 17 and 18.

The present disclosure may provide a semiconductor memory device and a method of operating the semiconductor memory device, which can improve program speed.

What is claimed is:

1. A semiconductor memory device, comprising:
   a memory cell array including a plurality of memory blocks;
   a peripheral circuit configured to perform a program operation on the memory cell array; and
   control logic configured to control the program operation performed by the peripheral circuit,
   wherein each of the plurality of memory blocks is coupled to a drain select line, a plurality of word lines, and first and second source select lines that correspond to the memory block, and
   wherein, during a program operation performed on a first memory block selected as a program target, among the plurality of memory blocks, the control logic controls the peripheral circuit so that a first source select line of a second memory block that is not selected as the program target, among the plurality of memory blocks, floats,
   wherein each of the plurality of memory blocks is further coupled to a third source select line, and the third source select line is interposed between the first source select line and the second source select line.

2. The semiconductor memory device according to claim 1, wherein:
   the program operation comprises a plurality of program loops, each including a precharge phase, a program phase, and a verify phase,
   the first memory block and the second memory block are coupled to a common source line,
   the first source select line is disposed closer to the common source line than the second source select line, and
   in the precharge phase, the control logic controls the peripheral circuit so that the first source select line coupled to the second memory block floats and a ground voltage is applied to a second source select line coupled to the second memory block.

3. The semiconductor memory device according to claim 2, wherein, in the precharge phase, the control logic controls the peripheral circuit so that the ground voltage is applied to a drain select line coupled to the second memory block.

4. The semiconductor memory device according to claim 3, wherein, in the precharge phase, the control logic controls the peripheral circuit so that a precharge voltage is applied to the common source line in a state in which the first source select line coupled to the second memory block floats.

5. The semiconductor memory device according to claim 2, wherein the peripheral circuit comprises:
   a first select line control switch configured to selectively couple a first source select line of the first memory block to a first selection ground line and to selectively couple a second source select line and a drain select line of the first memory block to a second selection ground line; and
   a second select line control switch configured to selectively couple the first source select line of the second memory block to the first selection ground line and to selectively couple the second source select line and a drain select line of the second memory block to the second selection ground line.

6. The semiconductor memory device according to claim 5, wherein:
   during the program operation performed on the first memory block, the first select line control switch is deactivated, and
   during the program operation performed on the first memory block, the second select line control switch is activated and then configured to electrically couple the first source select line of the second memory block to the first selection ground line and to electrically couple the second source select line and the drain select line of the second memory block to the second selection ground line.

7. The semiconductor memory device according to claim 6, wherein, in the precharge phase during the program operation performed on the first memory block, the first selection ground line floats.

8. The semiconductor memory device according to claim 6, wherein, in the precharge phase during the program operation performed on the first memory block, the ground voltage is applied to the second selection ground line.

9. The semiconductor memory device according to claim 1, wherein, during the program operation performed on the first memory block selected as the program target, among the plurality of memory blocks, the control logic controls the peripheral circuit so that a third source select line of the second memory block that is not selected as the program target, among the plurality of memory blocks, floats.

10. The semiconductor memory device according to claim 1, wherein, during the program operation performed on the first memory block selected as the program target, among the plurality of memory blocks, the control logic controls the peripheral circuit so that the ground voltage is applied to a third source select line of the second memory block that is not selected as the program target, among the plurality of memory blocks.

11. A method of operating a semiconductor memory device, the semiconductor memory device performing a program operation on a memory block selected from among a plurality of memory blocks, wherein the program operation comprises a plurality of program loops, each program loop comprising:
    a precharge phase of precharging a common source line;
    a program phase of programming a selected memory block; and
    a verify phase of verifying the selected memory block,
    wherein the precharge phase of precharging the common source line includes allowing a first source select line, among a plurality of source select lines coupled to an unselected memory block among the plurality of memory blocks, to float.

12. The method according to claim 11, wherein the precharge phase of precharging the common source line comprises:
    allowing the first source select line of the unselected memory block to float;
    applying a ground voltage to a second source select line, among the plurality of source select lines coupled to the unselected memory block; and
    applying a precharge voltage to the common source line.

13. The method according to claim 12, wherein the first source select line is disposed closer to the common source line than the second source select line.

14. The method according to claim 12, wherein applying the ground voltage to the second source select line includes applying the ground voltage to a drain select line coupled to the unselected memory block.

15. The method according to claim 11, wherein the program phase of programming the selected memory block comprises:
   applying a program pass voltage to a plurality of word lines coupled to the selected memory block; and
   applying a program voltage to a word line selected from among the plurality of word lines.

16. The method according to claim 15, wherein the program phase of programming the selected memory block includes allowing the first source select line coupled to the unselected memory block to remain floating.

17. The method according to claim 11, wherein the verify phase of verifying the selected memory block comprises:
   applying the ground voltage to the common source line;
   applying the ground voltage to the first source select line coupled to the unselected memory block; and
   applying a verify voltage to a word line selected from among a plurality of word lines coupled to the selected memory block and applying a verify pass voltage to unselected word lines.

18. The method according to claim 17, wherein applying the ground voltage to the first source select line includes applying the ground voltage to a second source select line, among the plurality of source select lines coupled to the unselected memory block.

19. The method according to claim 11, wherein the precharge phase of precharging the common source line includes applying an equalize voltage to a plurality of word lines coupled to the selected memory block.

\* \* \* \* \*